United States Patent
Teixeira et al.

(10) Patent No.: US 11,187,768 B2
(45) Date of Patent: Nov. 30, 2021

(54) CONTROLLED EXCITATION AND SATURATION OF MAGNETISATION TRANSFER SYSTEMS

(71) Applicant: King's College London, London (GB)

(72) Inventors: Rui Pedro Azeredo Gomes Teixeira, London (GB); Joseph Vilmos Hajnal, London (GB); Shaihan Jalal Malik, London (GB); Daniel John West, London (GB)

(73) Assignee: King's College London, London (GB)

(*) Notice: Subject to any disclaimer, the term of this patent is extended or adjusted under 35 U.S.C. 154(b) by 55 days.

(21) Appl. No.: 16/500,515

(22) PCT Filed: Apr. 6, 2018

(86) PCT No.: PCT/GB2018/050929
§ 371 (c)(1),
(2) Date: Oct. 3, 2019

(87) PCT Pub. No.: WO2018/185496
PCT Pub. Date: Oct. 11, 2018

(65) Prior Publication Data
US 2020/0057128 A1   Feb. 20, 2020

(30) Foreign Application Priority Data

Apr. 6, 2017 (GB) .................................... 1705577

(51) Int. Cl.
*G01V 3/00* (2006.01)
*G01R 33/50* (2006.01)
(Continued)

(52) U.S. Cl.
CPC ......... *G01R 33/50* (2013.01); *G01R 33/4838* (2013.01); *G01R 33/5605* (2013.01); *G01R 33/5614* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 5,521,503 A * 5/1996 Bodenhausen .... G01R 33/4608
324/307
6,271,665 B1 * 8/2001 Berr .................. G01R 33/56341
324/306
(Continued)

FOREIGN PATENT DOCUMENTS

CN    101803918 A  *  8/2010  ......... G01R 33/5617
EP      1059540 A2    12/2000
(Continued)

OTHER PUBLICATIONS

Charles Tallal, Magnetic Resonance Method, Aug. 18, 2010 (Year: 2010).*
(Continued)

*Primary Examiner* — Walter L Lindsay, Jr.
*Assistant Examiner* — Frederick Wenderoth
(74) *Attorney, Agent, or Firm* — Banner & Witcoff, Ltd.

(57) ABSTRACT

The present invention relate to a system and associate method of MRI and MR spectroscopy which provide stable measurements of the relaxation times, T1 and T2, by using tailored multi-band RF pulses that direct control of the saturation conditions in the background pool of macromolecular protons, and hence provide a flexible means to induce constant Magnetisation Transfer (MT) effects. In doing this, equal saturation of the background pool is obtained for all measurements independent of the parameters that may be changed, for example, the rotation rate used to obtain a desired flip angle, that is, the degree of change in the magnetisation of the free pool of protons.

13 Claims, 16 Drawing Sheets

(51) Int. Cl.
*G01R 33/483* (2006.01)
*G01R 33/56* (2006.01)
*G01R 33/561* (2006.01)

(58) Field of Classification Search
USPC .......................................................... 324/309
See application file for complete search history.

(56) References Cited

U.S. PATENT DOCUMENTS

| | | | |
|---|---|---|---|
| 6,285,900 B1* | 9/2001 | Stuber ................... | G01R 33/446 324/306 |
| 2009/0027051 A1* | 1/2009 | Stuber ................ | G01R 33/4828 324/309 |
| 2012/0268130 A1* | 10/2012 | Fautz ................ | G01R 33/4616 324/318 |
| 2015/0219735 A1* | 8/2015 | Miyazaki ........... | G01R 33/5605 324/309 |
| 2015/0301144 A1* | 10/2015 | Griswold ............. | A61B 5/4064 324/309 |
| 2015/0335478 A1* | 11/2015 | Cherkas .................. | A61F 9/008 606/5 |
| 2015/0362574 A1* | 12/2015 | Wu .................... | G01R 33/4818 324/322 |
| 2016/0109613 A1* | 4/2016 | Paulsen .................... | G01V 3/32 324/303 |
| 2017/0003365 A1* | 1/2017 | Rosen ................ | G01R 33/4824 |

FOREIGN PATENT DOCUMENTS

| | | |
|---|---|---|
| JP | 2005152534 A | 6/2005 |
| WO | 2004/013648 A1 | 2/2004 |
| WO | 2015/102169 A1 | 7/2015 |
| WO | 2016/179264 A1 | 11/2016 |

OTHER PUBLICATIONS

Oct. 10, 2018, International Search Report and Written Opinion, PCT/GB2018/050929.

Jul. 18, 2017, Search Report, GB1705577.3.

Huihui Ye et al., "Accelerating Magnetic Resonance Fingerprinting (MRF) USing t-Blipped Simultaneous Multislice (SMS) Acquisition," 2016, Magnetic Resonance in Medicine, vol. 75, pp. 2078-2085.

Rui Pedro A.G. Teixeira, et al., "Fast quantitative MRI using controlled saturation magnetization transfer," Jun. 10, 2018, Magnetic Resonance in Medicine, pp. 1-14.

Rui Pedro A.G. Teixeira, et al., "Robust VFA relaxometry by Continuous Saturation of Magnetization Transfer (CSMT) effects with Non-selective Multi-Band pulses," Apr. 7, 2017, International Society for Magnetic Resonance in Medicine, vol. 25, No. 73.

Simon Shah, et al., "Eliminating MT Contribution in Z-Spectra using Dual Band Macromolecular Background Suppression (DBMS)," May 15, 2015, International Society for Magnetic Resonance in Medicine, No. 1750.

* cited by examiner

CONTROLLED EXCITATION AND SATURATION OF MAGNETISATION TRANSFER SYSTEMS

TECHNICAL FIELD

The present invention relates to a method and system for magnetic resonance (MR) imaging, and in some embodiments a method and system for MR imaging using tailored multi-band RF pulses to achieve controlled saturation of systems that exhibit Magnetisation Transfer (MT).

BACKGROUND TO THE INVENTION AND PRIOR ART

Unlike CT and PET, which both can provide images expressed in absolute units, Magnetic Resonance Imaging (MRI) is usually deployed as a highly sensitive qualitative modality. Thus, although conventional MRI is a first line investigation for both radiological diagnosis and treatment monitoring of neurological disease, almost all assessments are based on images presented in arbitrary units. There is growing interest in quantitative MRI as a potential route to less subjective diagnosis (1) and to allow cross site comparison such as for clinical trials. Key MR parameters are the proton density (M0) and the two relaxation times T1 and T2, which describe how fast the magnetization in the tissue molecules changes after the electromagnetic field transmitter is turned off. The inter-site comparability of conventional T1 and T2 weighted images is still controversial (2), whereas absolute tissue specific measurement of T1 and T2 are expected to overcome inter-site bias (3, 4).

Many techniques have been developed to infer tissue proton density M0 and longitudinal relaxation time T1 properties (5) however, a consensus regarding the accuracy of each method has still to be found (6). In biological samples, a process called Magnetization Transfer (MT) is known to influence the observed relaxometry measurements (7, 8). To characterize tissue more fully, so called multiple-pool models have been suggested (8, 9), which try to take into account the different populations of protons present in macromolecular samples. Current clinical protocols for quantitative imaging generally fail to take MT correctly into account, so producing variable results that undermine their utility as secure diagnostic methods (6). Quantitative MT protocols can more precisely characterise tissue, but require more data to be collected so are not regarded as clinically feasible (9). MT effects directly alter the measured tissue values of M0 and T1 and, if not accounted for, these then lead to errors in M0, T1 and T2 estimation.

In more detail, MT relates to the exchange of magnetisation between the protons that produce the detected signals in MRI, which are commonly referred to as the free pool, and an invisible background population of protons residing on immobile macro-molecules, which are commonly referred to as the bound pool. As previously noted, full characterisation requires analysis using a multi-pool model, but clinical protocols would be most efficient if a single pool model could be applied. That is, if the effects of the background pool could be effectively nullified. A method is described herein that allows controlled saturation of the background protons in the measured sample, which can be used to ensure the validity of single-pool magnetization assumptions in relaxometry methods. The approach can also be used to provide a systematic set of images that can be used as part of a quantitative MT analysis.

Typically, MRI requires the application of one or more radio-frequency (RF) pulses, each with finite duration and time varying amplitude. If a single source of magnetization is present, such as in samples with free mobile protons (e.g. pure water), the time integral of the RF pulse induces rotation of the available magnetization which is responsible for the measured signal. In biological samples, where multiple pools of magnetization are always present, applied RF-pulses induce not only rotation of the free pool of protons but also a simultaneous partial saturation of the background pool of restricted protons, and these in combination alter the expected signal behaviour. If not considered, background pool effects necessarily biases relaxometry measurements as an extra source (or pathway) of magnetization recovery is interfering with the measured signal. To avoid this, multi-compartment models have been proposed which require more measurements to be sampled and therefore induce longer scanning times, so hindering clinical applicability.

As noted above, tissue relaxation times in MRI are known to be dependent on the measurement technique, with T1 in particular being influenced by MT and the RF conditions employed (12, 13). For a two pool system, the observed T1 depends on the saturation state of the background pool, which is modified by the RF ($B_1^+$) pulses in the measurement sequences. This effect can be quantified using the following equation (17) and the time structure of the sequence:

$$\langle W \rangle = \frac{\pi}{T_{RF}} \int_0^{T_{RF}} \omega_1^2(t) dt \; G(\Delta) = \frac{\pi}{T_{RF}} E_{RF} G(\Delta) \qquad [1]$$

where $T_{RF}$ is the duration of the pulse, $\omega_1(t) = \gamma \cdot B_1^+$ is the instantaneous rotation rate caused by the pulse with time varying amplitude $B_1^+$, $\gamma$ is the gyomagnetic ratio, $G(\Delta)$ models the absorption line-shape of the background magnetization pool and $E_{RF}$ is the integral of $\omega_1^2(t)$. In steady-state Variable Flip Angle (VFA) methods (15), a range of flip angles are deployed, creating variable saturation of the background pool within the measurement. Unless this is taken into account, the measured relaxation properties vary with the measurement parameters (13, 16).

SUMMARY OF THE INVENTION

Embodiments of the present invention relate to a system and associate method of MRI and MR spectroscopy which provide stable measurements of the relaxation times, T1 and T2, by using tailored multi-band RF pulses that allow direct control of the saturation conditions in the background pool of macro-molecular protons, and hence provide a flexible means to induce constant Magnetisation Transfer (MT) effects, or to achieve precisely varying MT effects. In the case of constant MR conditions, equal saturation of the background pool is obtained for all measurements independent of the parameters that may be changed, for example, the rotation rate used to obtain a desired flip angle, that is, the degree of change in the magnetisation of the free pool of protons. To achieve this, a new RF pulse is defined where the RF pulse energy is balanced between the free and the background protons such that different flip angles can be achieved in the free pool whilst maintaining control over the induced saturation of the background pool. In some applications, this helps to ensure that the effects of the background pool can be kept constant throughout the examination, and can therefore be effectively ignored. A further way of achieving this is to control the timing between the RF pulses to obtain overall constant saturation. This way, the total RF energy of each pulse is allowed to vary with varying flip angle, but the timing of the pulses adjusted to compensate for the changes in energy such that a constant level of saturation is maintained overall.

Under constant saturation, the measured signals effectively behave as a single pool of magnetization. This provides a reproducible measurement of M0 and T1, as well as removing errors in the estimation of T2. Consequently, this method of Controlled Saturation Magnetisation Transfer (CSMT) imaging makes it possible to achieve rapid generation of reproducible quantitative T1 and T2 maps using any of the currently available high resolution 3D clinical protocols (4, 10, 11, 18). In other applications CSMT imaging may be used to obtain a sequence of images each of which has precisely controlled MT conditions suitable, for example, for calculating the properties of both the free pool and the background pool.

A first aspect of the present invention provides a method of calculating a multi-band radio frequency (RF) pulse for use in magnetic resonance (MR) imaging or MR spectroscopy, wherein the multi-band RF pulse comprises an on-resonance band and at least one off-resonance band, and wherein the method comprises defining a target degree of rotation in the magnetisation, M, of a free pool of protons in an object, and calculating the parameters of the on-resonance band and the at least one off-resonance band based on the target degree of rotation, wherein the calculated parameters of the on-resonance band the at least one off-resonance band are such that, when the multi-band RF pulse is used as a parameter of MR imaging or spectroscopy, a predetermined amount of saturation occurs in a bound pool of protons in the object. As such, the parameters of the multi-band RF pulse are calculated such that they achieve the target degree of rotation in the free pool of protons, whilst maintaining a certain level of saturation of the background pool of protons when the RF pulse is used as a parameter of an MR scan. The calculated pulse therefore enables control of the saturation of the background pool.

Calculating the parameters of the on-resonance band and the at least one off-resonance band may comprise calculating the parameters of the on-resonance band based on the target degree of rotation, wherein the calculated parameters of the first band are such that, when the multi-band RF pulse is used as a parameter of MR imaging or spectroscopy, the target degree of rotation is induced in the free pool of protons; and calculating the parameters of the at least one off-resonance band based on the on-resonance band, wherein the calculated parameters of the at least one off-resonance band are such that, when the multi-band RF pulse is used as a parameter of MR imaging or spectroscopy, the predetermined amount of saturation occurs in the bound pool of protons. As such, the on-resonance part of the RF pulse is defined to ensure that a certain degree of rotation in the free pool of electrons is achieved when the RF pulse is used as a parameter of an MR scan. Once the on-resonance band has been defined, the parameters of the at least one off-resonance band can be calculated to ensure that, when the RF pulse is used as a parameter of an MR scan, the specific amount of saturation of the background pool of protons is achieved.

The method may further comprise calculating a plurality of multi-band RF pulses corresponding to a plurality of target degrees of rotation, wherein the predetermined amount of saturation is constant for the plurality of multi-band RF pulses such that, when used as a parameter of MR imaging or spectroscopy, the plurality of multi-band RF pulses achieve controlled Magnetisation Transfer conditions. In some arrangements, the plurality of multi-band RF pulses achieve constant Magnetisation Transfer conditions. That is, the saturation of the background pool of protons is kept constant independent of the degree of rotation in the free pool of protons. In this respect, the saturation effect on the background pool may be exactly the same for each RF pulse, or at least similar enough that only very small differences in the Magnetisation Transfer effects are exhibited, to the extent that single-pool assumptions are still valid. In other arrangements, the multi-band RF pulse is calculated so as to accurately control the degree of rotation of the free pool and the degree of saturation of the background pool.

The method may further comprise setting the predetermined amount of saturation based on a reference multi-band RF pulse, wherein the setting the predetermined amount of saturation comprises (i) defining a reference degree of rotation in the magnetisation, M of a free pool of protons in an object; (ii) calculating a reference multi-band RF pulse corresponding to the reference degree of rotation; (iv) determining the amount of saturation occurring in a bound pool of protons of the object when the reference multi-band RF pulse is used as a parameter of MR imaging or spectroscopy; and (iii) setting the predetermined amount of saturation based on the determined amount of saturation.

Alternatively, the predetermined amount of saturation may be set based on a target amount of saturation.

In embodiments of the present invention, defining the target degree of rotation of magnetisation, M, may comprise defining a target flip angle, ca.

In embodiments of the present invention, the free pool of protons is a first spin population such that in use the duration of the multi-band RF pulse is shorter than a first transverse relaxation time (T2) of the first spin population, whereas the bound pool of protons is a second spin population such that in use the duration of the multi-band RF pulse is longer than a second transverse relaxation time (T2) of the second spin population.

A second aspect of the present invention provides a method of magnetic resonance (MR) imaging, comprising calculating a plurality of multi-band RF pulses as outlined above, performing an MR scan on an object using the plurality of multi-band RF pulses to thereby obtain a plurality of MR signals, wherein each of the plurality MR signals corresponds to one of the plurality of a multi-band RF pulses, and generating an image of the object based on the plurality of MR signals.

Such a method may further comprise measuring the relaxation times T1 and T2 of the plurality of MR signals, as well as other parameters such as the population density M0. The generating an image of the object may further comprise generating a T1 map and/or a T2 map.

The generating an image may further comprise calculating a myelin water fraction from the plurality of MR signals. By using the plurality of multi-band RF pulses to achieve controlled MT conditions, the reliability of the myelin water fraction estimation can be improved. The myelin water fraction is commonly used for understanding neurological conditions where the myelin in the brain starts to disappear, for example, multiple sclerosis. It is also measured to try to study brain development, since myelin is generated in the brain as a baby develops into early childhood.

The generating an image may also comprise generating a saturation weighted image. By using the plurality of multi-band RF pulses to achieve controlled MT conditions, saturation weighted images may be generated using steady-state sequences such as Spoiled Gradient Recalled Echo (SPGR) or balanced Steady State Free Precession (bSSFP).

A third aspect of the present invention provides an apparatus for calculating a multi-band RF pulse for use in magnetic resonance (MR) imaging or MR spectroscopy, wherein the multi-band RF pulse comprises an on-resonance band and an at least one off-resonance band, the apparatus comprising a processor, a computer readable medium, the computer readable medium storing on or more instruction(s) arranged such that when executed the processor is caused to (a) define a target degree of rotation in the magnetisation, M, of a free pool of protons in an object; and (b) calculate the parameters of the on-resonance band and the at least one off-resonance band based on the target degree of rotation, wherein the calculated parameters of the on-resonance band the at least one off-resonance band are such that, when the multi-band RF pulse is used as a parameter of MR imaging or spectroscopy, a predetermined amount of saturation occurs in a bound pool of protons in the object.

The processor may be further caused to calculate the parameters of the on-resonance band based on the target degree of rotation, wherein the calculated parameters of the first band are such that, when the multi-band RF pulse is used as a parameter of MR imaging or spectroscopy, the target degree of rotation is induced in the free pool of protons, and calculate the parameters of the at least one off-resonance band based on the on-resonance band, wherein the calculated parameters of the at least one off-resonance band are such that, when the multi-band RF pulse is used as a parameter of MR imaging or spectroscopy, a predetermined amount of saturation occurs in the bound pool of protons.

The processor may be further caused to calculate a plurality of multi-band RF pulses corresponding to a plurality of target degrees of rotation, wherein the predetermined amount of saturation is constant for the plurality of multi-band RF pulses such that, when used as a parameter of MR imaging or spectroscopy, the plurality of multi-band RF pulses achieve controlled Magnetisation Transfer conditions. In some arrangements, the plurality of multi-band RF pulses achieve constant Magnetisation Transfer conditions. In this respect, the saturation effect on the background pool may be exactly the same for each RF pulse, or at least similar enough that only very small differences in the Magnetisation Transfer effects are exhibited, to the extent that single-pool assumptions are still valid. In other arrangements, the multi-band RF pulse is calculated so as to accurately control the degree of rotation of the free pool and the degree of saturation of the background pool.

In some embodiments, the processor may be caused to set the predetermined amount of saturation based on a reference multi-band RF pulse, wherein the setting the predetermined amount of saturation may comprise (i) defining a reference degree of rotation in the magnetisation, M of the free pool of protons in an object; (ii) calculating a reference multi-band RF pulse corresponding to the reference degree of rotation; (iv) determining the amount of saturation occurring in a bound pool of protons in the object when the reference multi-band RF pulse is used as a parameter of MR imaging or spectroscopy; and (iii) setting the predetermined amount of saturation based on the reference amount of saturation.

Alternatively, the processor may be caused to set the predetermined amount of saturation based on a target amount of saturation.

The processor may be arranged to define the target degree of rotation of magnetisation, M, by defining a target flip angle, $\alpha$.

In embodiments of the present invention, the free pool of protons is a first spin population such that in use the duration of the multi-band RF pulse is shorter than a first transverse relaxation time (T2) of the first spin population, whereas the bound pool of protons is a second spin population such that in use the duration of the multi-band RF pulse is longer than a second transverse relaxation time (T2) of the second spin population.

A fourth aspect of the present invention provides a system for magnetic resonance (MR) imaging, comprising an MR scanner arranged to perform an MR scan on an object using a plurality of multi-band RF pulses to thereby generate a plurality of MR signals, wherein the plurality of multi-band RF pulses achieve controlled Magnetisation Transfer conditions, and wherein each of the plurality MR signals corresponds to one of the plurality of multi-band RF pulses, and generate an image of the object based on the plurality of MR signals. In some arrangements, the plurality of multi-band pulses may achieve constant Magnetisation Transfer conditions.

The system may be further arranged to measure the relaxation times T1 and T2 of the plurality of MR signals. The system may also be arranged to generate an image of the object comprising a T1 map and/or a T2 map.

In some embodiments, the system further comprises an apparatus as outlined above for calculating the plurality of multi-band RF pulses. That is, the system comprising the scanner calculates and implements the RF pulses. Alternatively, the plurality of RF pulses may be calculated at a separate location and communicated to the system by some suitable means.

The system may be further arranged to calculate a myelin water fraction from the plurality of MR signals.

The system may be further arranged to generate a saturation weighted image.

A fifth aspect of the present invention provides a method of MR imaging, comprising obtaining a plurality of multi-band RF pulses that maintain controlled saturation conditions in a background pool of protons in an object to be imaged, and imaging the object using the plurality of multi-band RF pulses.

A sixth aspect of the present invention provides an apparatus for MR imaging, wherein the apparatus is arranged to obtain a plurality of multi-band RF pulses that maintain controlled saturation conditions in a background pool of protons in an object to be imaged, and image the object using the plurality of multi-band RF pulses.

In some cases, the plurality of multi-band RF pulses may maintain constant saturation conditions.

A seventh aspect of the present invention provides a radiofrequency (RF) pulse for use in magnetic resonance (MR) imaging or spectroscopy, wherein the RF pulse comprises spectral properties such that in use the RF pulse manipulates a first spin population in an object, the duration of the RF pulse being shorter than a first transverse relaxation time (T2) of the first spin population, the spectral properties of the RF pulse being further configured such that in use the RF pulse controls the saturation of a second spin population of the object, the duration of the RF pulse being longer than a second transverse relaxation time (T2) of the second spin population.

The RF pulse may be a multi-band RF pulse comprising an on-resonance band that is configured in use to rotate the first spin population, and at least one off resonance band that is configured in use to produce a controlled amount of saturation of the second spin population.

A further aspect of the present invention provides a system for magnetic resonance (MR) imaging, comprising an MR scanner arranged to perform an MR scan on an object using a plurality of RF pulses to thereby generate a plurality of MR signals, wherein a time parameter of the plurality of RF pulses is adapted in dependence on the energy of the RF pulses to thereby achieve controlled Magnetisation Transfer conditions, and wherein each of the plurality MR signals corresponds to one of the plurality of RF pulses, and generate an image of the object based on the plurality of MR signals.

In doing so, the total RF energy is allowed to vary for different flip angles, that is, the amount of saturation for each flip angle is allowed to vary. To compensate for the varying energy, the timing of the pulses is adjusted to obtain a constant average RF energy, and thus a constant average amount of saturation. For example, if the RF energy of one sequence of pulses at a certain flip angle is double that of another sequence of RF pulses at a different flip angle, the length of time between the pulses in that sequence may be doubled, or the pulse duration may be halved, to compensate for this difference in energy.

The time parameter may comprise a time interval between the plurality of RF pulses, that is, the length of time between respective pulses, also referred to as the repetition period. In this respect, the repetition period may be adapted according to a proportional relationship with the energy of the RF pulses. The time parameter may further comprises a pulse duration of the plurality of RF pulses, that is, the length of time each pulse lasts for. In this respect, the pulse duration may be adapted according to an inversely proportional relationship with the energy of the RF pulses. Similarly, one or both of the time interval and pulse duration may be adjusted to maintain a constant average energy.

The system may be configured to adjust the degrees of rotation in the magnetisation, M, of a free pool of protons in the object such that the energy of the plurality of RF pulses is varied, the system being further configured to adapt the time parameter such that the average RF pulse energy is maintained at a predetermined amount to thereby maintain a constant level of saturation in a bound pool of protons in the object.

The time parameter of the plurality of RF pulses may be controlled to achieve constant Magnetisation Transfer conditions.

A further aspect of the present invention provides a method of magnetic resonance (MR) imaging, comprising performing an MR scan on an object using a plurality of RF pulses to thereby generate a plurality of MR signals, wherein a time parameter of the plurality of RF pulses is adapted in dependence on the energy of the RF pulse to thereby achieve controlled Magnetisation Transfer conditions, and wherein each of the plurality MR signals corresponds to one of the plurality of RF pulses, and generating an image of the object based on the plurality of MR signals.

Yet a further aspect provides a system for magnetic resonance (MR) imaging, comprising an MR scanner arranged to perform an MR scan on an object using a plurality of RF pulses to thereby generate a plurality of MR signals, wherein at least one parameter of the plurality of RF pulses is controlled to achieve controlled Magnetisation Transfer conditions, and wherein each of the plurality MR signals corresponds to one of the plurality of RF pulses, and generate an image of the object based on the plurality of MR signals.

In some cases, the plurality of RF pulses may comprise a plurality of multi-band RF pulses having an on-resonance band and at least one off-resonance band, wherein one or more parameters of the on-resonance band and the at least one off-resonance band are controlled such that a predetermined amount of saturation occurs in a bound pool of protons in the object. As such, the MT conditions are controlled by changing the parameters of the RF pulse itself.

The parameters of the on-resonance band and the at least one off-resonance band may be controlled based on a plurality of target degrees of rotation in the magnetisation, M, of a free pool of protons in the object. That is, the parameters of the RF pulses are adjusted in order to achieve a predetermined amount of saturation for a variety of different flip angles.

Alternatively, the at least one parameter of the plurality of RF pulses is a time parameter of the plurality of RF pulses, the time parameter of the plurality of RF pulses being adapted in dependence on the energy of the RF pulse. That is to say, the timings of the RF pulses are adjusted to compensate for the varying energy of the RF pulses in order to obtain an overall average amount of saturation.

The time parameter may comprise a time interval between the plurality of RF pulses, that is, the length of time between respective pulses, also referred to as the repetition period. In this respect, the repetition period may be adapted according to a proportional relationship with the energy of the RF pulses. The time parameter may further comprises a pulse duration of the plurality of RF pulses, that is, the length of time each pulse lasts for. In this respect, the pulse duration may be adapted according to an inversely proportional relationship with the energy of the RF pulses. Similarly, one or both of the time interval and pulse duration may be adjusted to maintain a constant average energy.

The system may be configured to adjust the degrees of rotation in the magnetisation, M, of a free pool of protons in the object such that the energy of the plurality of RF pulses is varied, the system being further configured to adapt the time parameter such that the average RF pulse energy is maintained at a predetermined amount to thereby maintain a constant level of saturation in a bound pool of protons in the object.

The at least one parameter of the plurality of RF pulses may be controlled to achieve constant Magnetisation Transfer conditions.

A further aspect of the present invention provides a method of magnetic resonance (MR) imaging, comprising performing an MR scan on an object using a plurality of RF pulses to thereby generate a plurality of MR signals, wherein the performing comprises controlling at least one parameter of the plurality of RF pulses to achieve controlled Magnetisation Transfer conditions, and wherein each of the plurality MR signals corresponds to one of the plurality of RF pulses, and generating an image of the object based on the plurality of MR signals.

BRIEF DESCRIPTION OF THE DRAWINGS

Embodiments of the invention will now be further described by way of example only and with reference to the accompanying drawings, wherein like reference numerals refer to like parts, and wherein:

FIG. 9(*b*) is an image showing results of the operation of the described embodiments;

DETAILED DESCRIPTION OF EMBODIMENTS OF THE INVENTION

A brief overview of embodiments of the invention will now be given.

In biological samples, where multiple pools of magnetization are always present, applied RF pulses induce not only rotation of the free pool of protons but also a simultaneous partial saturation of the background pool of restricted protons. The background pool of protons is characterized by its short T2 (shorter than the duration of the RF pulse) and as a consequence does not produce an observable signal, however, since the energy of the applied RF pulses is absorbed by the background pool, this ultimately affects the relaxometry measurements of the free pool, specifically, the T1 measurement. This phenomenon is known as Magnetisation Transfer (MT). If the effects of MT are not taken into account, this can lead to errors in the T1 and T2 measurements. To take the saturation of the background pool into consideration, multi-pool modelling is usually required which is considerably time consuming. The present invention addresses this by enabling single pool assumptions to be validly made, that is, by eliminating the need to consider the effects of the background pool of restricted protons.

Figure 16:
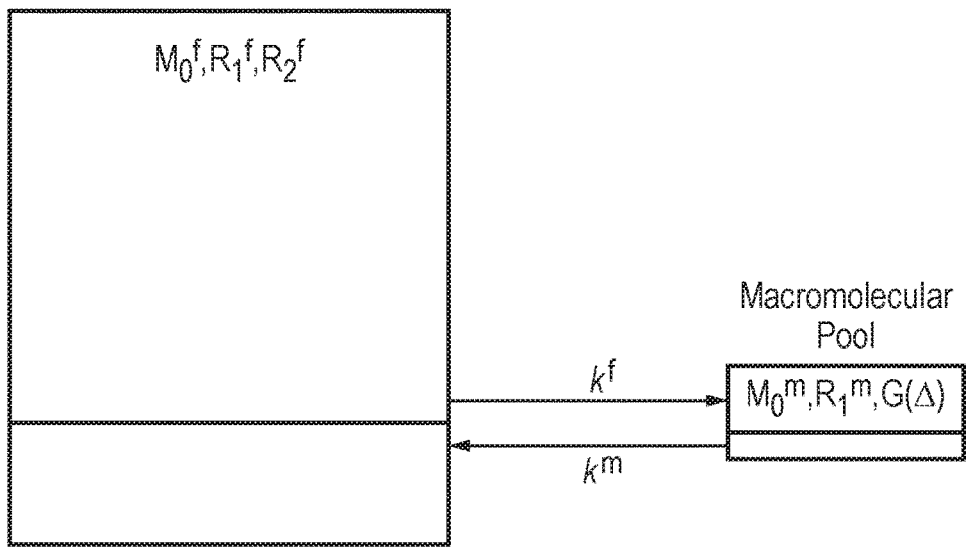
FIG. 16 illustrates a multi-pool system in which the present invention is used.

A schematic representation of a two-pool system is shown by FIG. 16. Both the free pool and the macromolecular pool have their own equilibrium magnetisation (M0) and spin lattice interaction rate (R1). The free pool also has an intrinsic spin-spin interaction rate (R2), whilst the macromolecular spin-spin interaction is parameterised by the absorption line-shape G. Both pools can exchange at a first order exchange rate.

In variable flip angle (VFA) relaxometry, a series of relaxometry measurements are obtained for a tissue sample by acquiring images under different RF pulses, for example, RF pulses of finite time and varying amplitude (or vice versa) to achieve a variety of flip angles, α, in the free pool.

In this respect, the RF pulse is used to rotate the magnetisation, M, of the free pool of protons in order to obtain an observable signal, with the achieved flip angle being used to characterises this rotation. However, as different RF conditions are employed, an unavoidable variable saturation of the background pool is induced.

To get the measurements for all the required flip angles under control, the energy of the RF pulse can be balanced to ensure that the saturation of the background pool is kept constant for every target flip angle.

Normally, to account for the complex nature of biological samples, VFA relaxometry can be extended such that multiple-pool (normally 2-pool) magnetization is assumed. To characterize this, typically, a sequence of RF pulses is employed, varying between on-resonance pulses and off-resonance pulses. Both the on-resonance and off-resonance pulses have a saturation effect on the background pool, whilst only the on-resonance pulses have an excitation effect on the free pool. That is, the on-resonance excitation causes rotation in the magnetisation, M, of the free pool.

The present invention implements a single non-selective multi-band (MB) RF pulse of finite time that has both on-resonance and off-resonance contributions, wherein changes in the on-resonance contribution required to achieve a particular flip angle is balanced with a matching off-resonance contribution such that the total RF energy is the same for any target flip angle. However, in some cases, the off-resonance contribution may be set independent of the flip angle. That is, the total RF energy can be altered such that, saturation of the background pool is kept independently of the desired rotation of the free pool and imaging timings.

Under fixed conditions, the saturation of the background pool has a benign effect such single pool assumptions can be made. That is, a single pool model can be used to accurately fit the variable flip angle data producing reliable relaxation parameter values that do not depend the particular choices of flip angle deployed. This allows for an accurate measurement of M0, T1 and T2 under a reported RF power, and subsequently improved tissue characterisation using T1 and T2 maps.

In further detail, an embodiment of the present invention allows rapid generation of high resolution T1 and T2 maps of biological samples. For example, it enables rapid generation of high resolution T1 and T2 maps of the brain within approximately 15 minutes. As such, embodiments of the prior art are able to generate T1 and T2 maps in around the same time as previous methods (15, 18), but with a higher signal to noise ratio.

Figure 1:
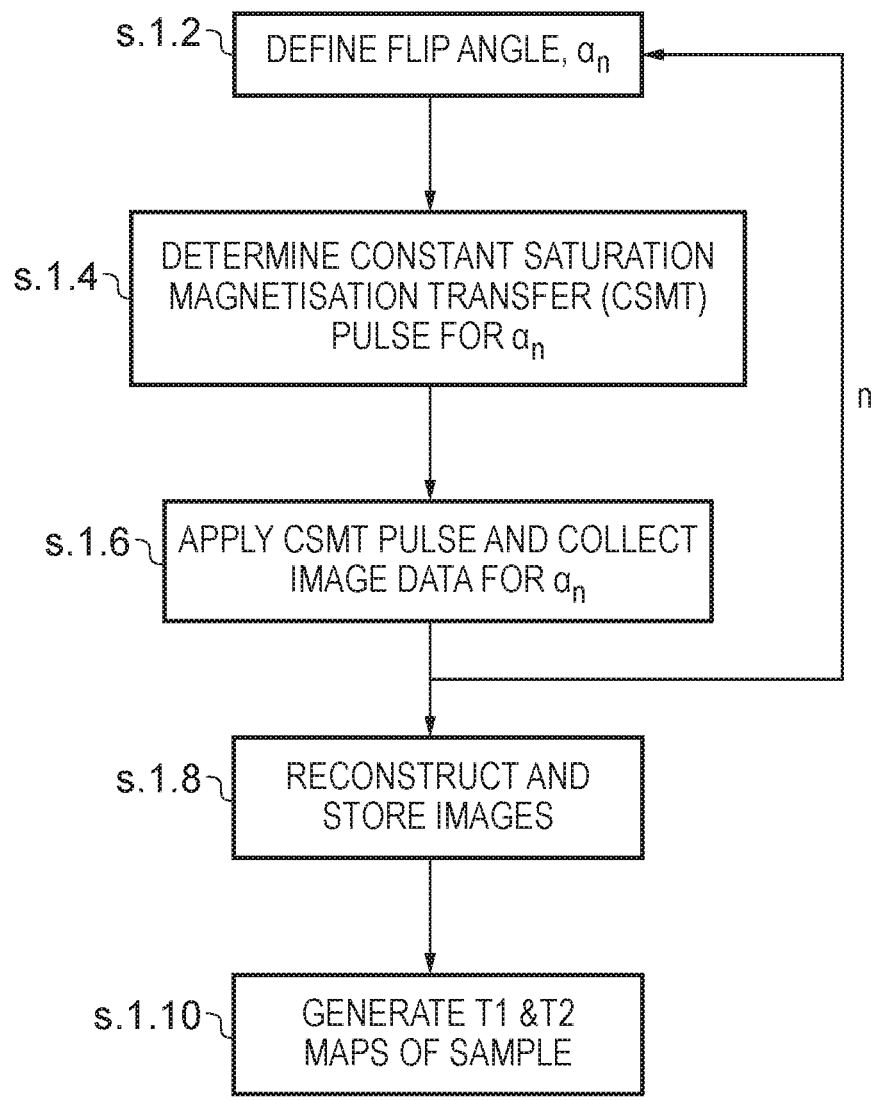
FIG. 1 is a process diagram illustrating the method of MR imaging according to embodiments of the invention.

A method of imaging a biological sample according to the present invention is shown in FIG. 1. In the first step, the user selects which RF-power is desired. At s.1.2, a target flip angle, $\alpha_n$, and imaging times are defined. At s.1.4, the multi-band CSMT pulse required for each target flip angle $\alpha_n$ is determined given the RF-power and imaging timings requested. The resulting CSMT pulse is then applied to obtain and collect image data for that flip angle, at s.1.6. The sampled image will then reconstructed and stored, at s.1.8. Steps 1.2-1.8 can then be repeated for every prescribed flip angle. As described above, the on-resonance contribution for each defined flip angle is balanced with a matching off-resonance contribution in order to maintain the saturation conditions set in the first iteration. Once all of the sample images have been collated, the relaxation values $T1^{app}$ and T2 of the free pool are measured, at s.1.10. Once signal measurements for each defined target angle have been obtained, T1 and T2 maps of the biological sample, for example, a brain is generated at s.1.10.

Figure 3:
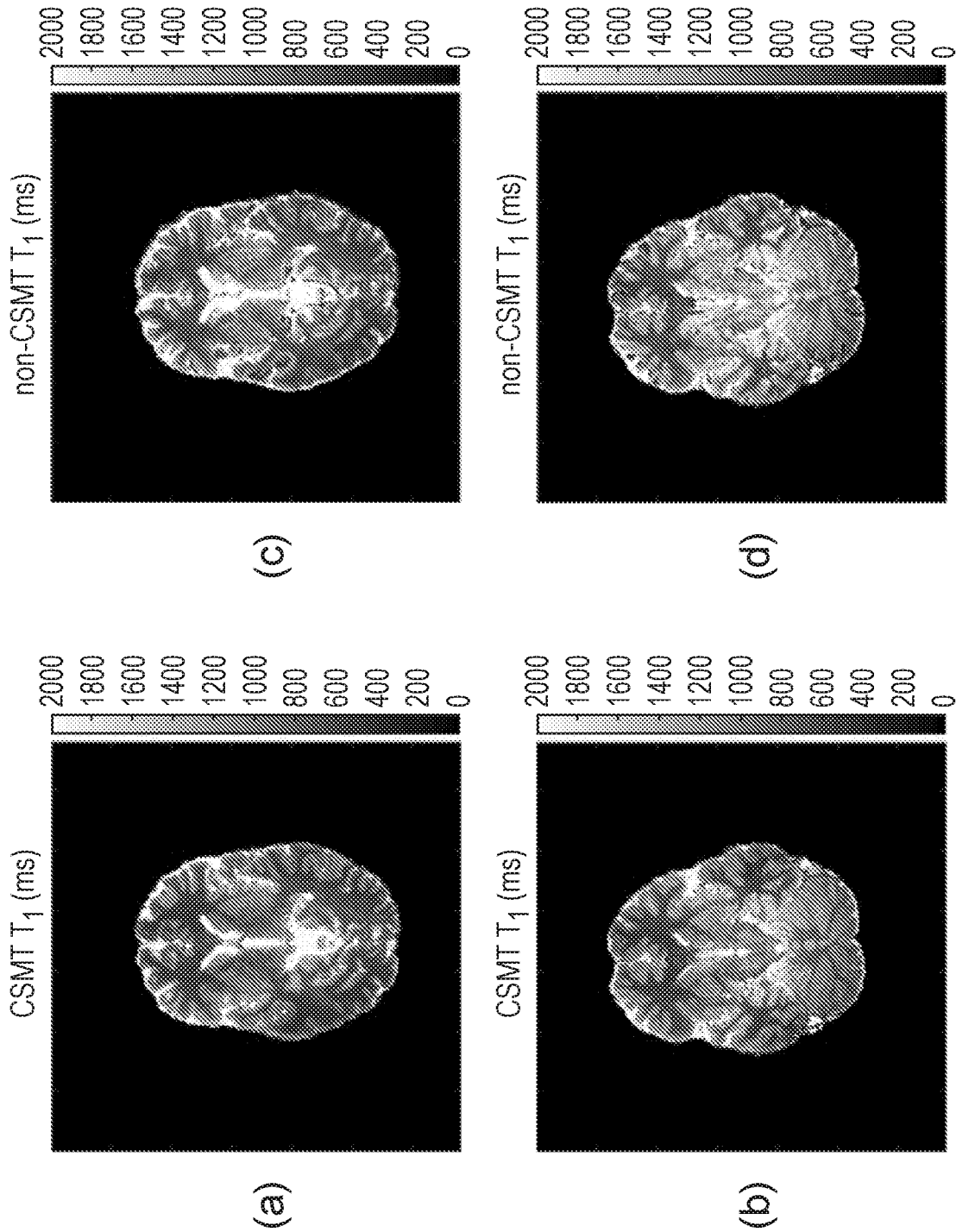
FIG. 3 is a series of images relating to results of the operation of the described embodiments

An example of a T1 map of a brain generated using the above method is illustrated by items (a) and (b) in FIG. 3. Items (c) and (d) of FIG. 3 show a T1 map of the same brain which have been generated using a conventional pulse. There is a clear improvement in the relaxation time resolution achieved using the CSMT pulse.

Figure 4:
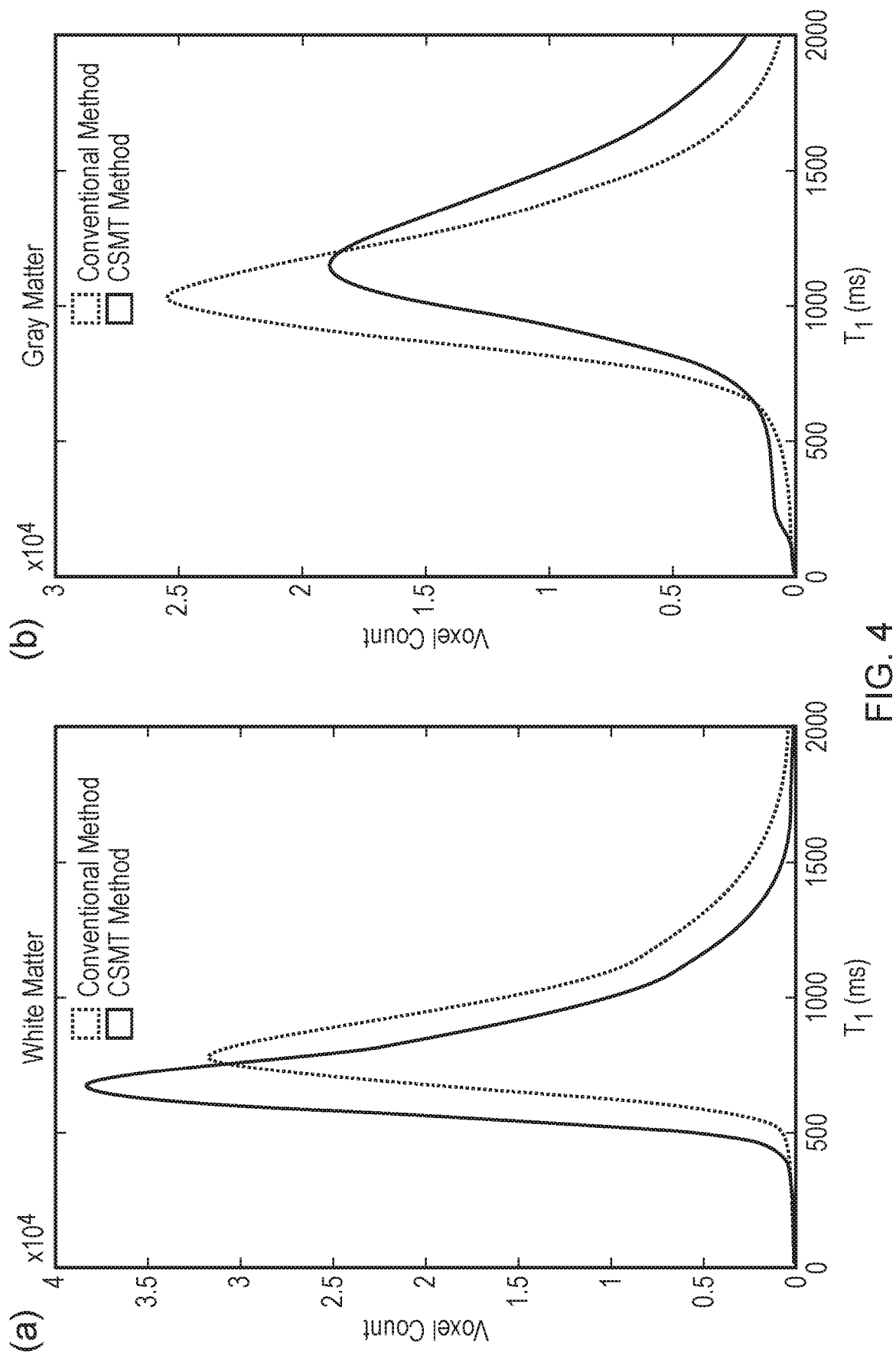
FIG. 4 is a set of charts relating to results of the operation of the described embodiments.

FIGS. 4 to 7 further demonstrate the improved relaxation measurements obtained using embodiments of the present invention. FIG. 4 illustrates histograms of T1 relaxation times for the brain of a normal volunteer (i.e. having no tissue abnormalities) when measured using a conventional pulse and a CSMT pulse. Graph (a) shows the T1 relaxation times for white matter, whilst graph (b) shows the T1 relaxation times for grey matter. Both graphs show how the use of a CSMT pulse leads to a narrower distribution values, which indicates a reduced level of modelling errors.

Figure 5:
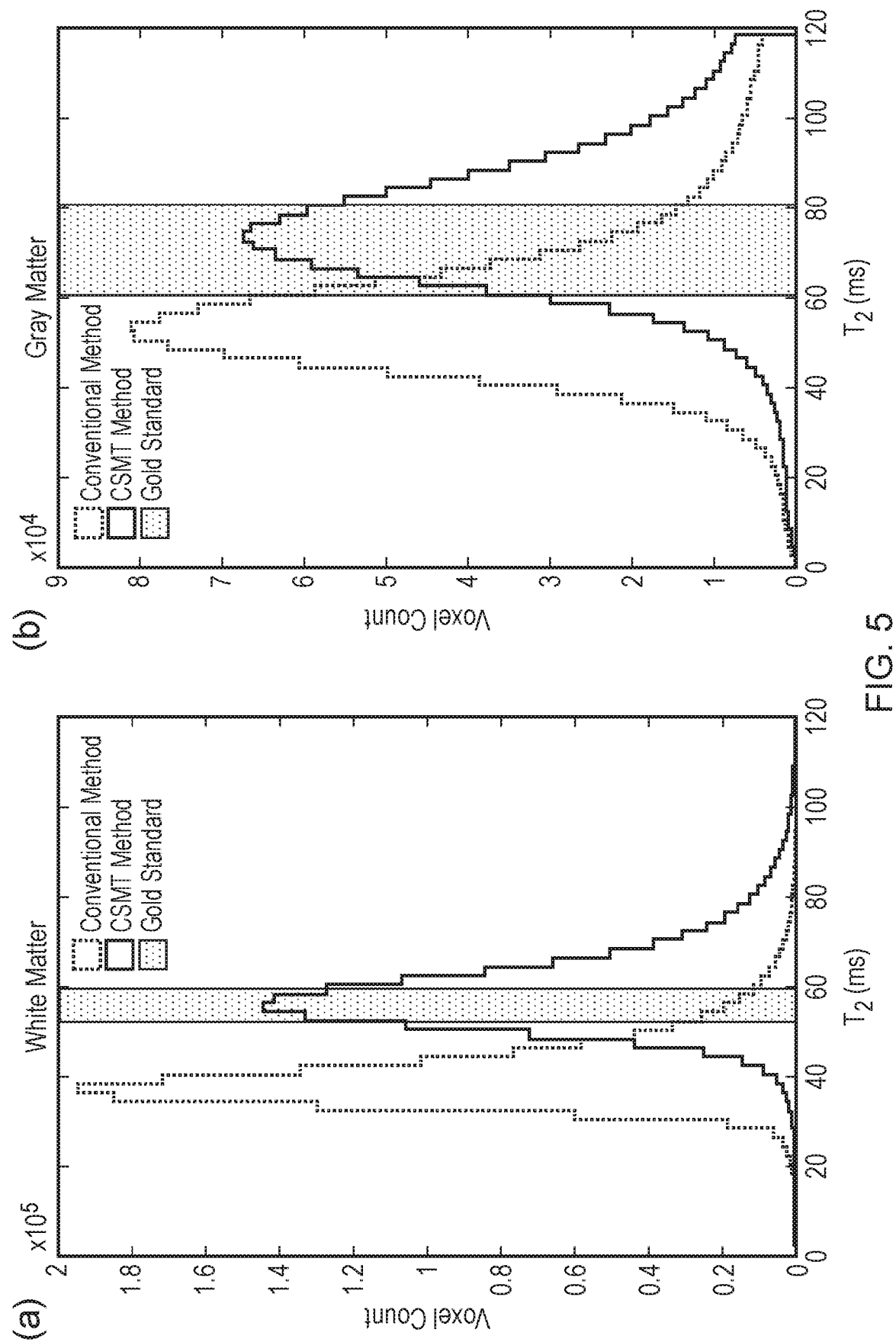
FIG. 5 is a set of charts relating to results of the operation of the described embodiments.

Similarly, FIG. 5 illustrates histograms of T2 relaxation times for the brain a normal volunteer (i.e. having no tissue abnormalities) when measured using a conventional pulse and a CSMT pulse. Graph (a) shows the T2 relaxation times for white matter, whilst graph (b) shows the T2 relaxation times for grey matter. Both graphs show that use of the CSMT pulse restores the estimate T2 to the correct value, wherein the correct value is normally assessed by a much slower method ("gold standard") that does not provide high resolution over the whole brain, and is thus not suitable for clinical use.

Figure 6:
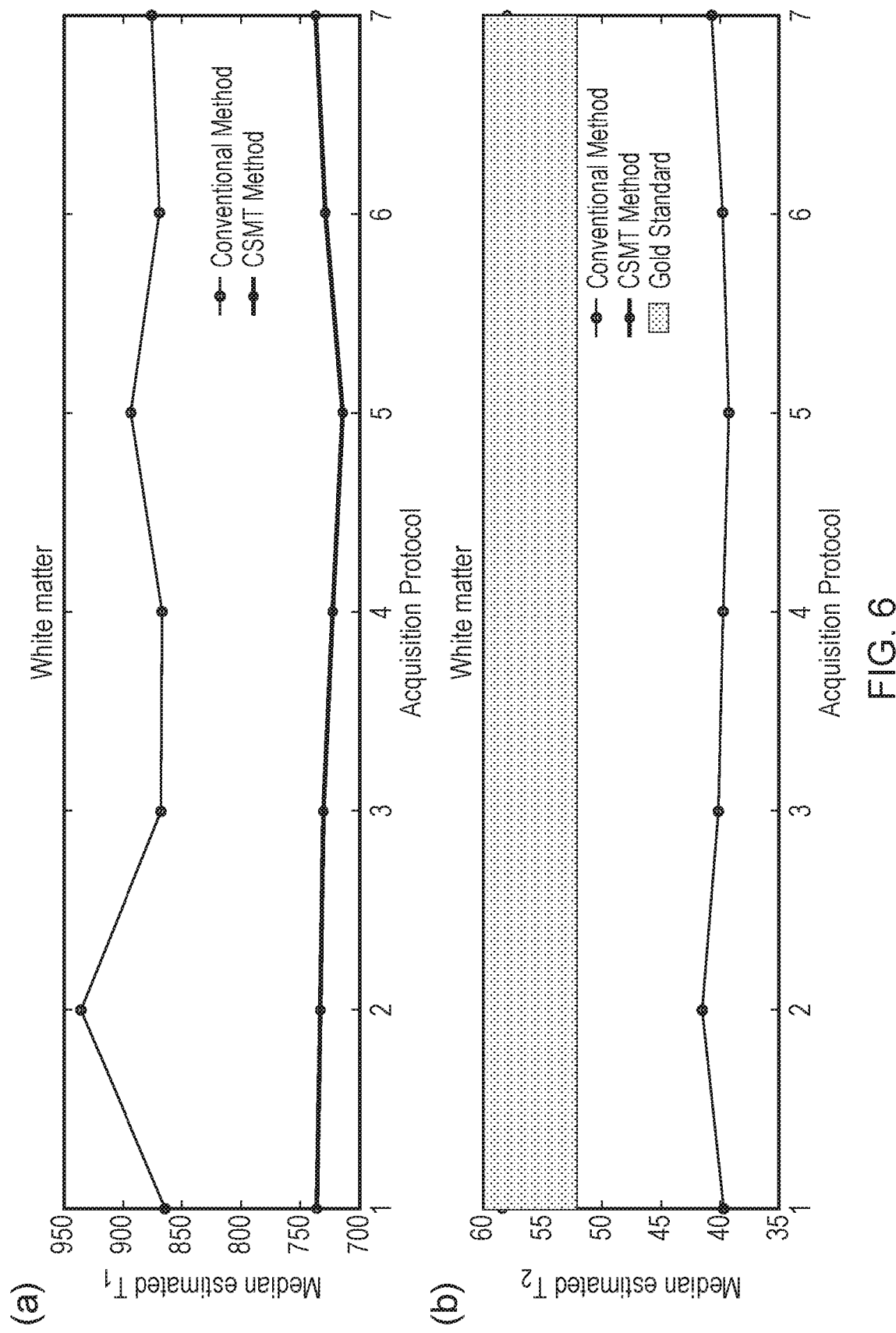
FIG. 6 is a set of charts relating to results of the operation of the described embodiments.
Figure 7:
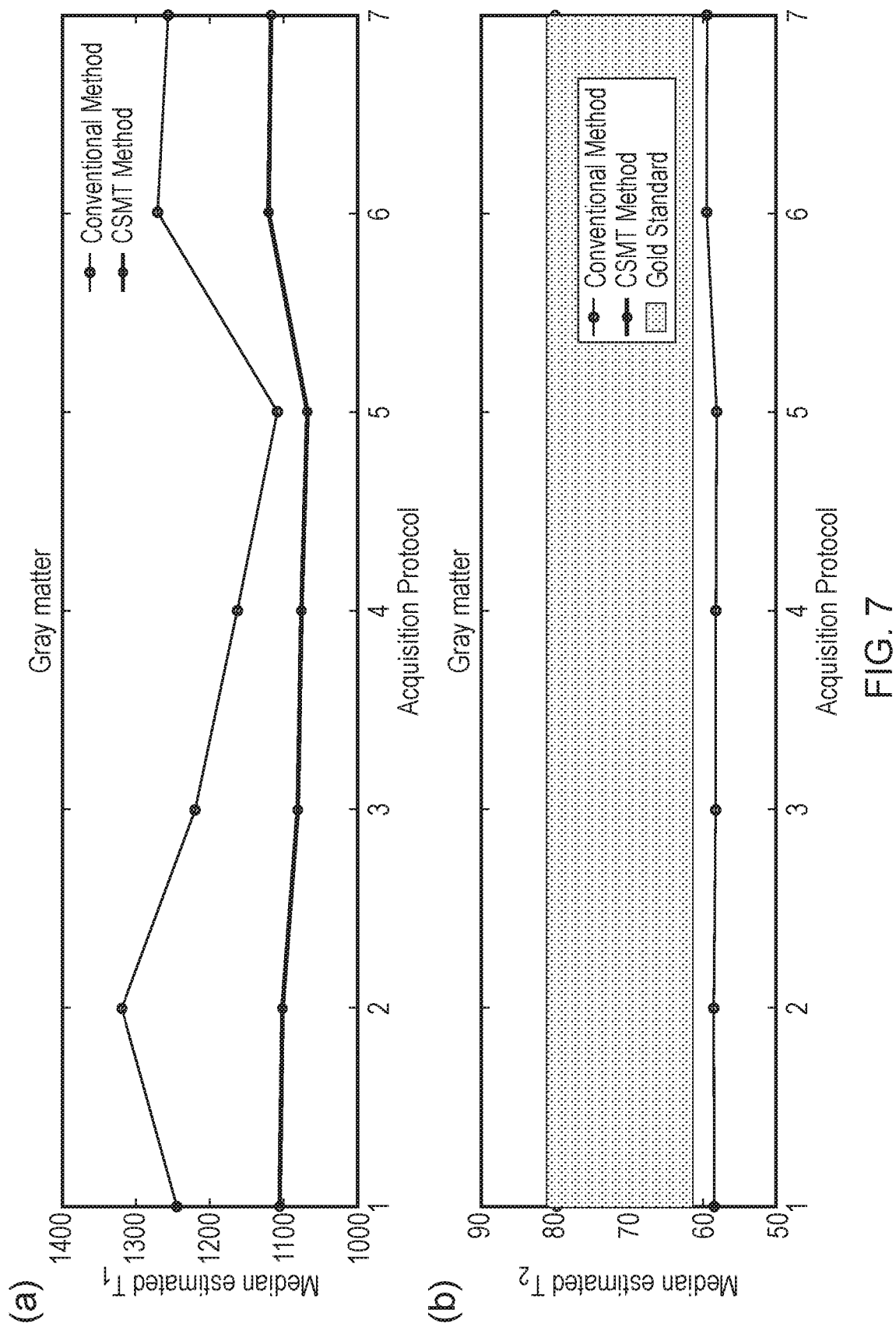
FIG. 7 is a set of charts relating to results of the operation of the described embodiments.

FIGS. 6 and 7 illustrates the estimated median relaxation times in White Matter of a normal volunteer vary as the details of the acquisition protocol are changed, that is, as different sets of flip angles $\alpha_n$ are employed. Graph (a) of both FIGS. 6 and 7 shows the median T1 relaxation time, whilst graph (b) of FIGS. 6 and 7 shows the median T2 relaxation time. All of these graphs show that the use of CSMT pulses greatly reduces the variations caused by protocol changes. For example, in graph (a) of FIGS. 6 and 7, the median T1 values for conventional pulses (top line) vary greatly, whilst the median T1 values for CSMT pulses (bottom line) stay substantially constant. Similarly, in graph (b) of FIGS. 6 and 7, the median T2 values for conventional pulses (bottom line) is variable, whilst the median T2 values for CSMT pulses (top line) stays substantially constant. Furthermore, the T2 values for the CSMT pulses are again shown to be restored to their true value, as determined by the slower "gold standard" method.

Figure 2:
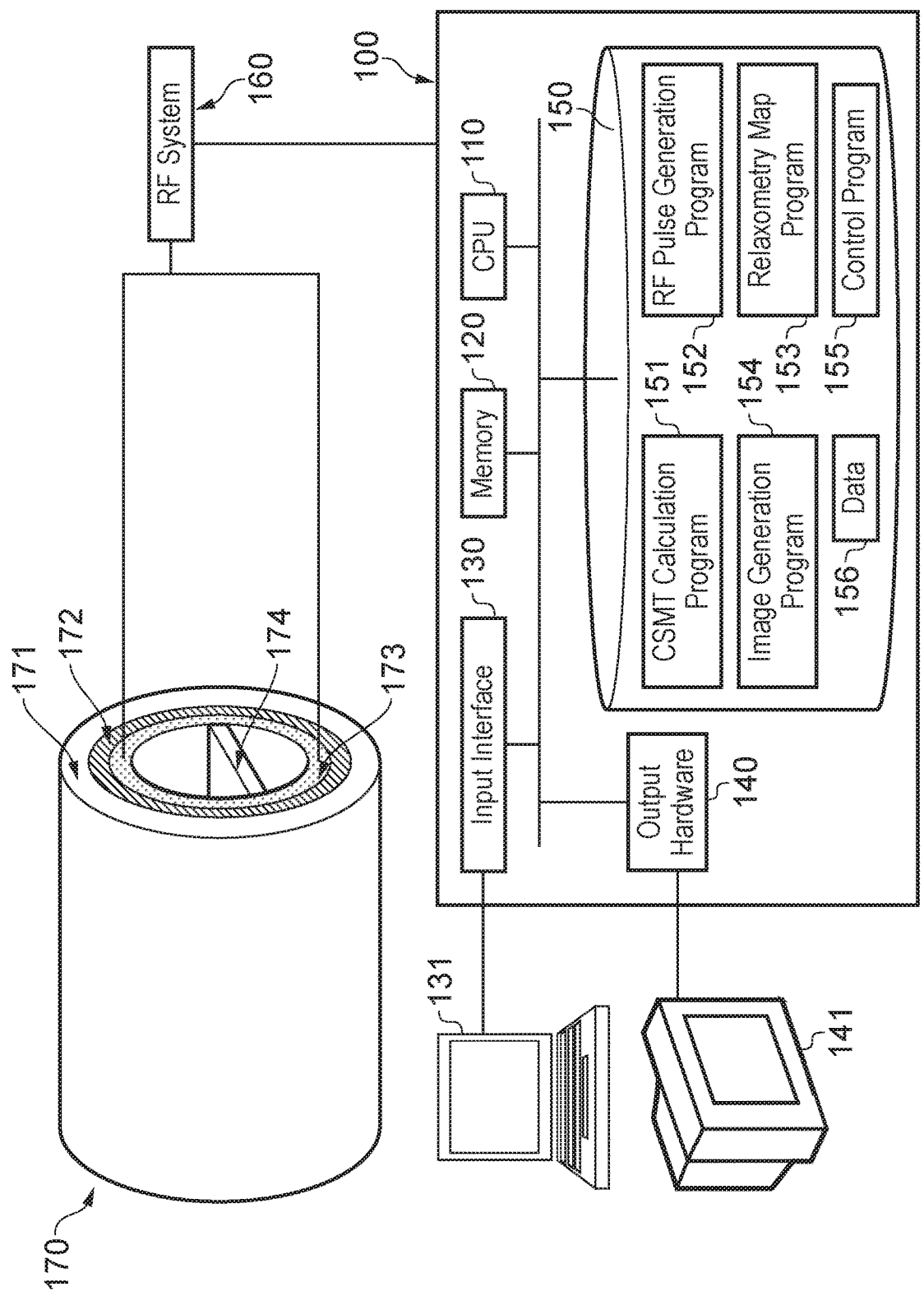
FIG. 2 is a system block diagram which forms the basis for embodiments of the invention.

FIG. 2 illustrates, by way of example, the system components that may form the platform for embodiments of the present invention. The computer system 100 comprises a central processing unit (CPU) 110, a working memory 120, input interface 130 arranged to receive control inputs from the user via an input device 131 such as a computer with a keyboard, mouse or other controller, and output hardware 140 arranged to provide output information to the user via a visual display unit 141 such as a computer, television or other visual display.

The computer system 100 may also be provided with a computer readable storage medium 150 such as a hard disk drive (HDD), flash drive, solid state drive, or any other form of general purpose data storage, upon which stored data 156 and various control programs are arranged to enable the system to operate according to embodiments of the present invention. For example, a control program 155 is provided and arranged to provide overall control of the system to perform the embodiments of the present invention. This control program 155 may, for example, receive user inputs and launch other programs to perform specific tasks. The other programs under the control of the control program 155 include a CSMT calculation program 151, an RF pulse generation program 152, a relaxometry map program 153 and an image generation program 154. These programs 151-154 will be discussed in more detail below.

The computer system 100 is connected to an MR scanner 170 comprising a magnet 171 for generating the static magnetic field, $B_0$, a set of gradient coils 172, a patient table 174, and an RF coil 173. The RF coil 173 may comprise a single coil arranged to both transmit the RF pulse and receive the MR signal. Alternatively, a separate RF transmitter and RF receiver may be used to transmit the RF pulse and receive MR signal, respectively. The RF coil 173 may be connected to an RF system 160 which receives inputs from the RF pulse generation program 152 to transmit an RF pulse to the RF coil 173, and conversely receive an MR signal back from the RF coil 173 for processing.

It should be appreciated that various other components and systems would of course be known to the person skilled in the art to permit the MR system to operate. For example, the gradient coils 172 may be connected to a gradient system that receives instructions from a program stored on the computer readable storage medium 150 to produce magnetic field gradients.

To scan an object on the patient table 174 according to the present invention, the user may first input the RF-power level desired as well as a set of target flip angles, $\alpha=1 \ldots n$, via the input device 130 and input interface 130, as in s.1.2 of FIG. 1. The CSMT calculation program 151 is then launched to calculate the CSMT pulse required for each defined flip angle and imaging timings, that is, to perform s.1.4 as described above. The parameters of the CSMT pulse for a defined flip angle are then input to the RF pulse generation program 152, which instructs the RF system 160 to transmit the CSMT pulse to the RF coil 173, as in s.1.6. The MR scanner 170 then scans the object on the patient table 174 using the generated CSMT pulse, and a signal from the RF coil 173 is transmitted back through the RF system 160 to the computer system 100. Once a signal has been transmitted back to the computer system 100, the control program 156 launches the image generation program 154 to reconstruct and store the image data collected by the RF system 160, as in s.1.8. This process will be repeated for each of the n target flip angles. Once signal measurements have been made for every target flip angle, the relaxometry program 153 will be launched to generate T1 and T2 maps of the scanned object to be displayed on the visual display device 141, as in s.1.10.

As such, the present invention may be implemented on all modern MRI systems and therefore paves the way to quantitative MR imaging for routine diagnosis and to support clinical trials.

Experimental Methods and Results

Figure 8:
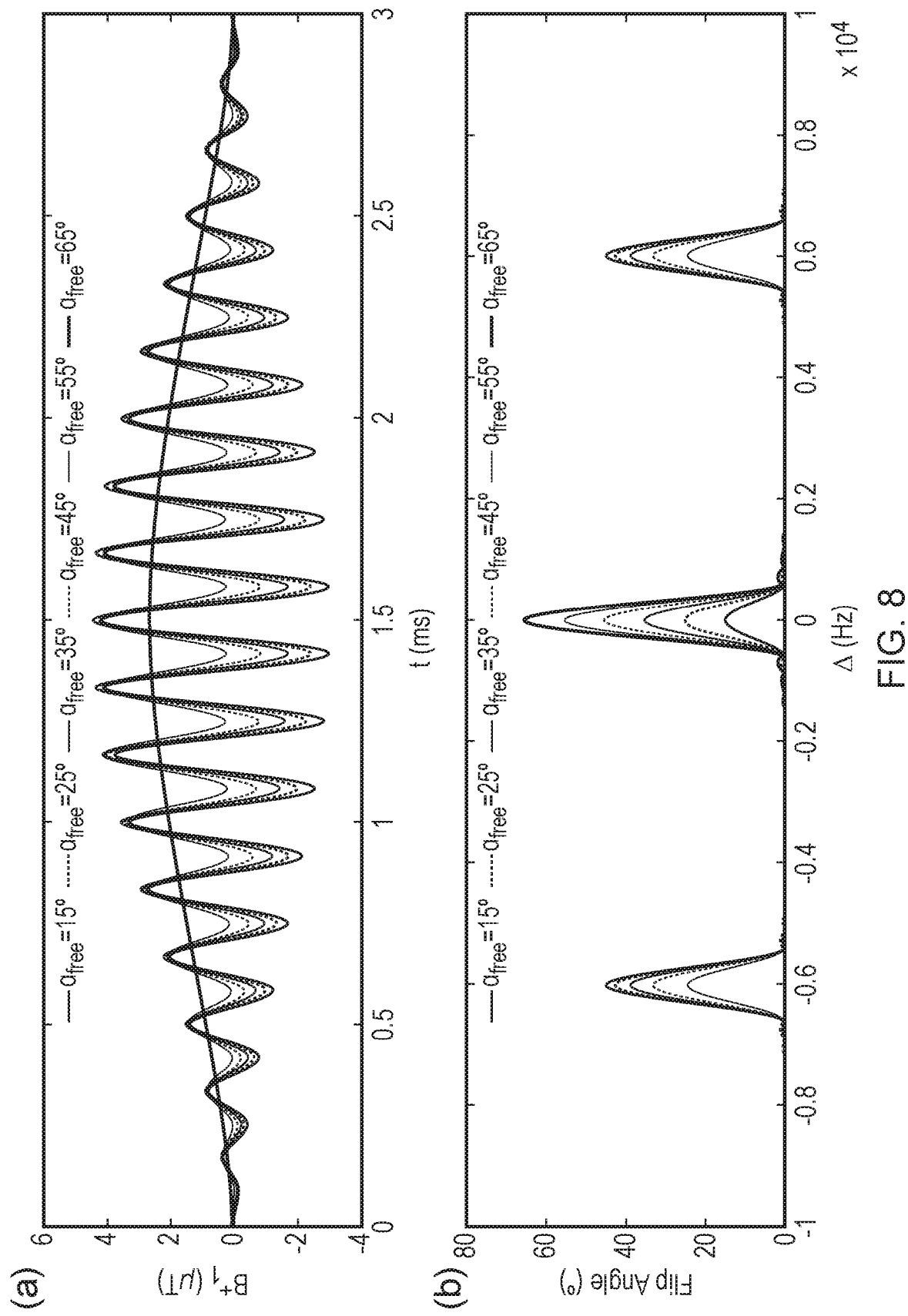
FIG. 8 is a set of charts relating to results of the operation of the described embodiments.

For the case of constant saturation, controlled saturation MT (CSMT) conditions are achieved by creating a pulse that balances changes in on-resonance ($\Delta=0$) RF to achieve a required flip angle ($\alpha_{free}$) with a matched off resonance contribution to keep $P_{RF}$ at a desired value. For example, starting with a sinc-gauss RF pulse scaled to produce a reference flip angle, $\alpha_{ref}=2\pi\gamma \int_0^{T_{RF}} \omega_1^{ref}(t)dt$, the CSMT excitation was created with symmetric bands at offset frequencies $\pm\Delta$ by adding a scaled cosine modulated replica of the on-resonant pulse, as illustrated in FIG. 8. By enforcing a relative scaling of the two components as defined in equation [2], not only is the saturation state of the background pool kept under control, it is kept constant regardless of the defined flip angle:

$$\omega_1^{CSMT}(t) = 2\pi\gamma\left[\frac{\alpha_{free}}{\alpha_{ref}}\omega_1^{ref}(t) + \kappa\omega_1^{ref}(t)\cos(\Delta t)\right], \quad [2]$$

$$\text{s.t.} \int_0^{T_{RF}}(\omega_1^{CSMT}(t))^2 dt = \int_0^{T_{RF}}(\omega_1^{ref}(t))^2 dt$$

where $\kappa$ is varied to satisfy the equal power constraint. Ideally, the background pool saturation should be independent of the balance between on- and off-resonance bands. Since $G(\Delta)$ is not completely flat, $\Delta$ should be minimised, but without introducing direct on-resonant saturation of free water.

FIG. 8 illustrates a time representation of the proposed CSMT pulse designed to keep $P_{RF}$ constant while achieving different flip angles (a), and frequency representation of the rotation induced due to the CSMT pulse for each flip angle (b). Note that the off-resonance rotation has no meaning due to the inherently short T2 of the restricted-pool of magnetization (~14 µs).

Experiments were performed on three Healthy Volunteers (HV) (ages 22-58 years) who gave informed consent. The CSMT pulse was simulated and tested with increasing $E_{RF}$ values of 0.86 µT$^2$ ms, 3.45 µT$^2$ ms, 13.81 µT$^2$ ms and 55.24 µT$^2$ ms on an Agarose phantom with 2%, 4% and 8% volume/volume concentrations to find combinations of $T_{RF}$ and that minimised direct on resonance saturation when =0, while providing efficient sequences, leading to 3 ms and 6 KHz respectively. Data was acquired with: 6°, 8°, 10°, 12°, 14°, 16° for SPGR (Spoiled Gradient recalled acquisition in the steady state) and 15°, 25°, 35°, 45°, 55°, 65° for SSFP (Steady-state free precession) with RF phase increment 180° per excitation, plus 25° and 55° for SSFP with RF phase increment 0°. To keep exchange effects between magnetization pools constant, readout (TE) and repetition (TR) times were kept constant at 3.5 ms and 7 ms respectively. In-vivo measurement used a sagittal geometry with 250× 250×250 mm$^3$ FOV, SENSE-2 for both AP and RL and acquired voxel size 0.83 mm$^3$, total time 2 m13 s per FA. An AFI[6] map with resolution of 43 mm3 was acquired to correct for spatial transmit field inhomoegeneities. For comparison, the same data was acquired using a simple scaled block pulse ($T_{RF}$=0.6 ms). To assess stability of the estimation with and without CSMT, multiple flip angle subsets of the acquired measurements (Table 1) were used to estimate $T_1$ using DESPOT1 and $T_1$,$T_2$ using a Joint System Relaxometry (JSR) approach[7] which simultaneously fits SPGR and SSFP signal models.

Table 1 provides a summary of flip angle subsets explored in order to inspect stability of the relaxometry estimation. The highlighted flip angles correspond to each measurement used at its corresponding subset.

Results

Figure 9A:
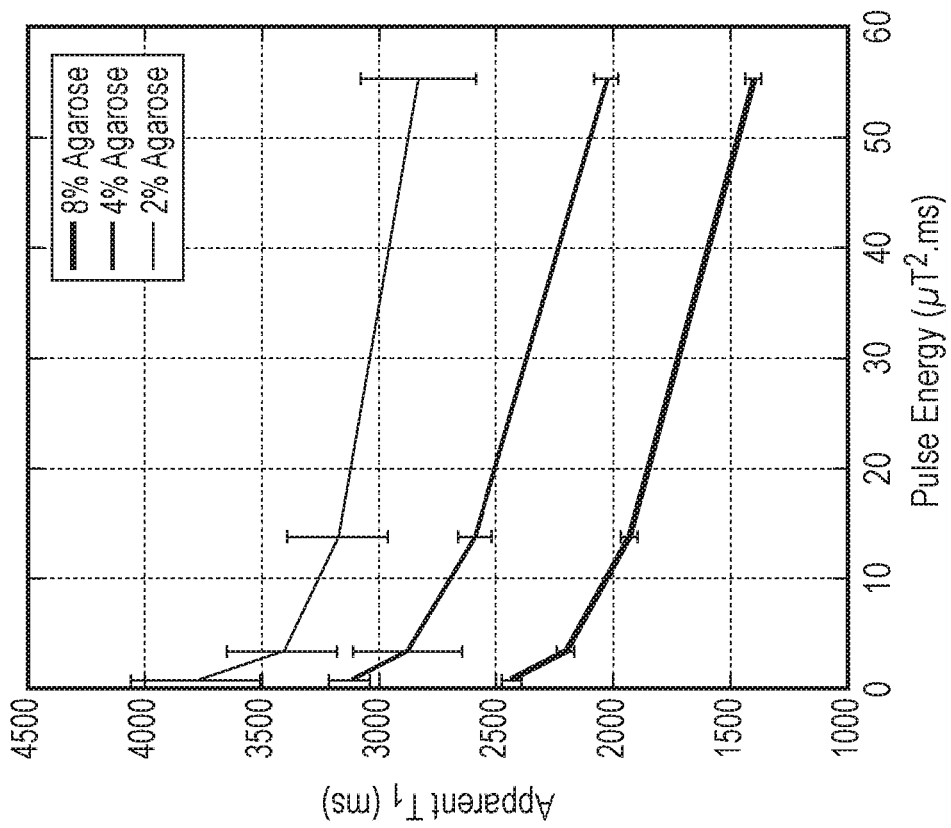
FIG. 9(*a*) is a chart relating to results of the operation of the described embodiments.
Figure 9B:
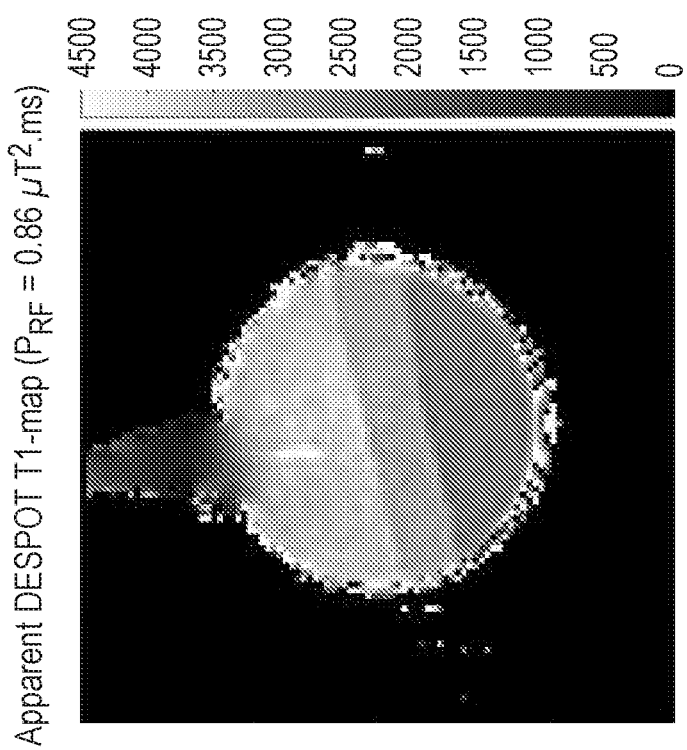

FIGS. 9(a)-(b) summarise how apparent $T_1$ (from DESPOT1) alters for Agarose as the $E_{RF}$ of the CSMT pulse is increased. FIG. 9(a) shows how the apparent mean DESPOT T1 measurement alters as a function of CSMT pulse energy. FIG. 9(b) provides an example of a DESPOT T1 map of the 3-layer phantom at increasing concentration of Agarose from top to bottom.

Figure 10:
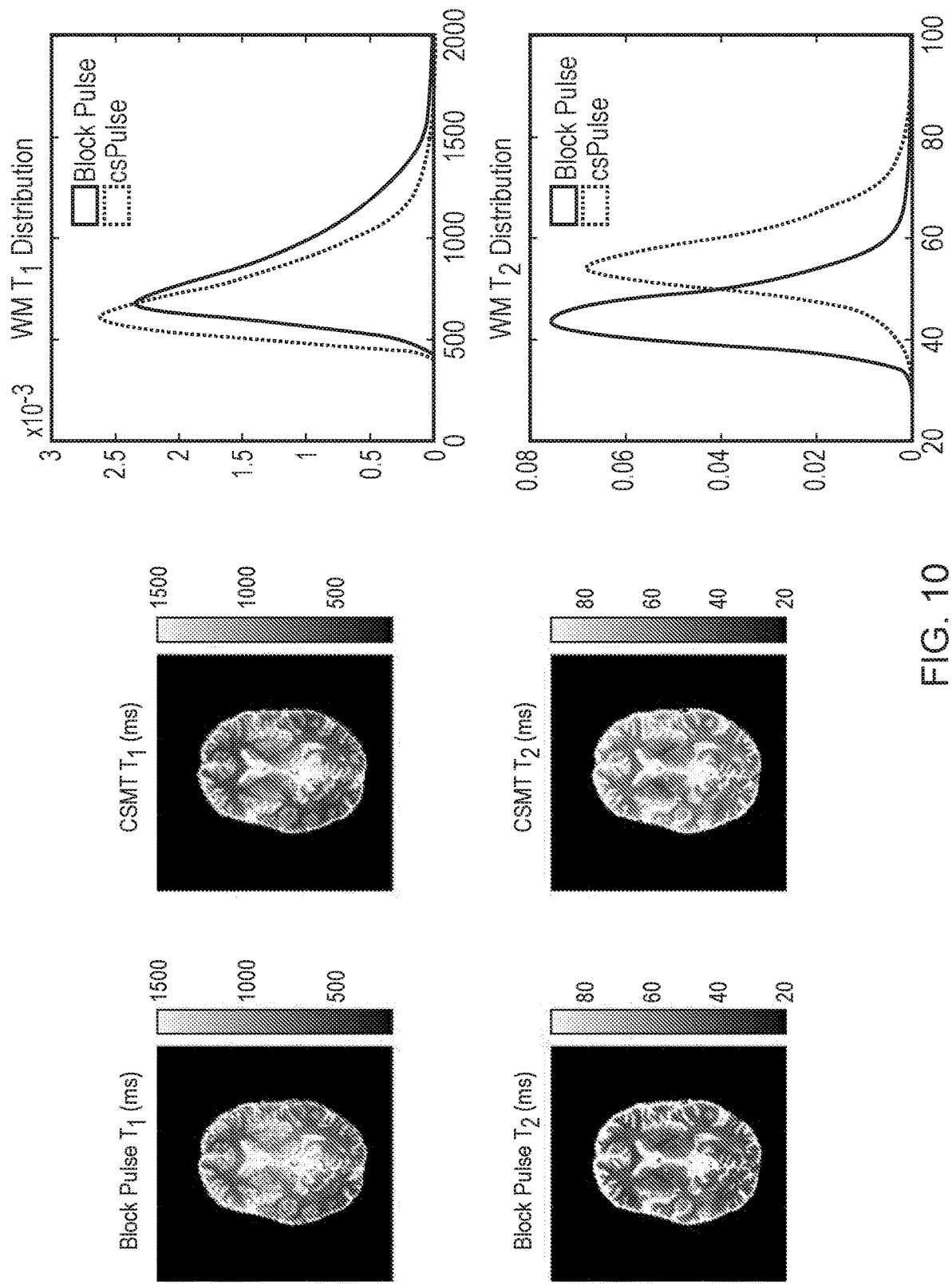
FIG. 10 is a set of charts and images relating to results of the operation of the described embodiments.

FIG. 10 shows $T_1$ (top) and $T_2$ (bottom) maps in an example axial slice using all measured data for both a typical block pulse (a) and a CSMT pulse (b). This shows the comparison between JSR T1 and T2 maps when using a block pulse or a CSMT pulse to generate excitation. For each case, all available flip angles were used to estimate the relaxometry parameters. Deep grey matter shows improved estimation when using the CSMT compared to the standard block pulse. Furthermore, T2 relaxation times are more consistent with reported spin-echo measurements (15).

Figure 11:
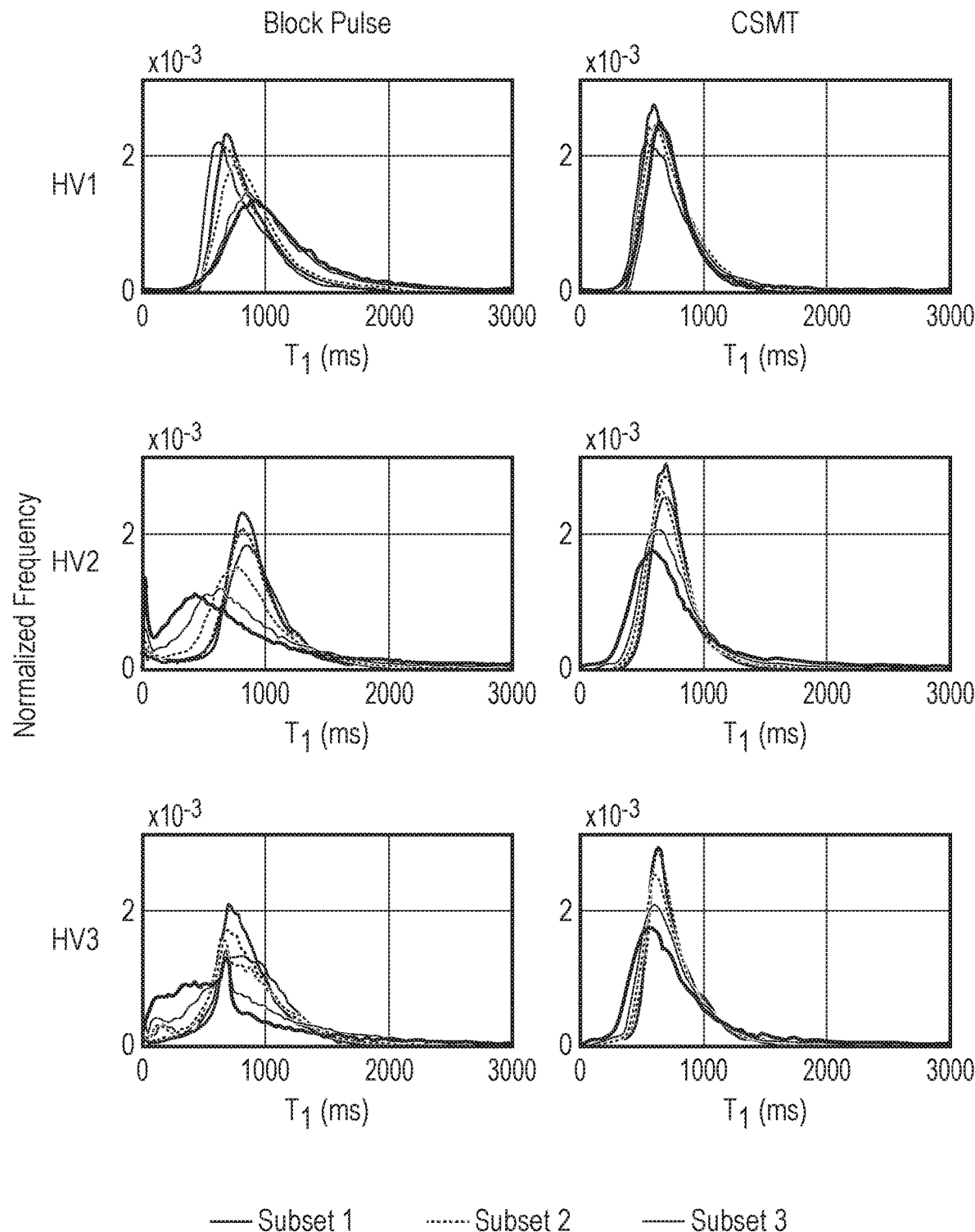
FIG. 11 is a set of charts relating to results of the operation of the described embodiments.
Figure 11:
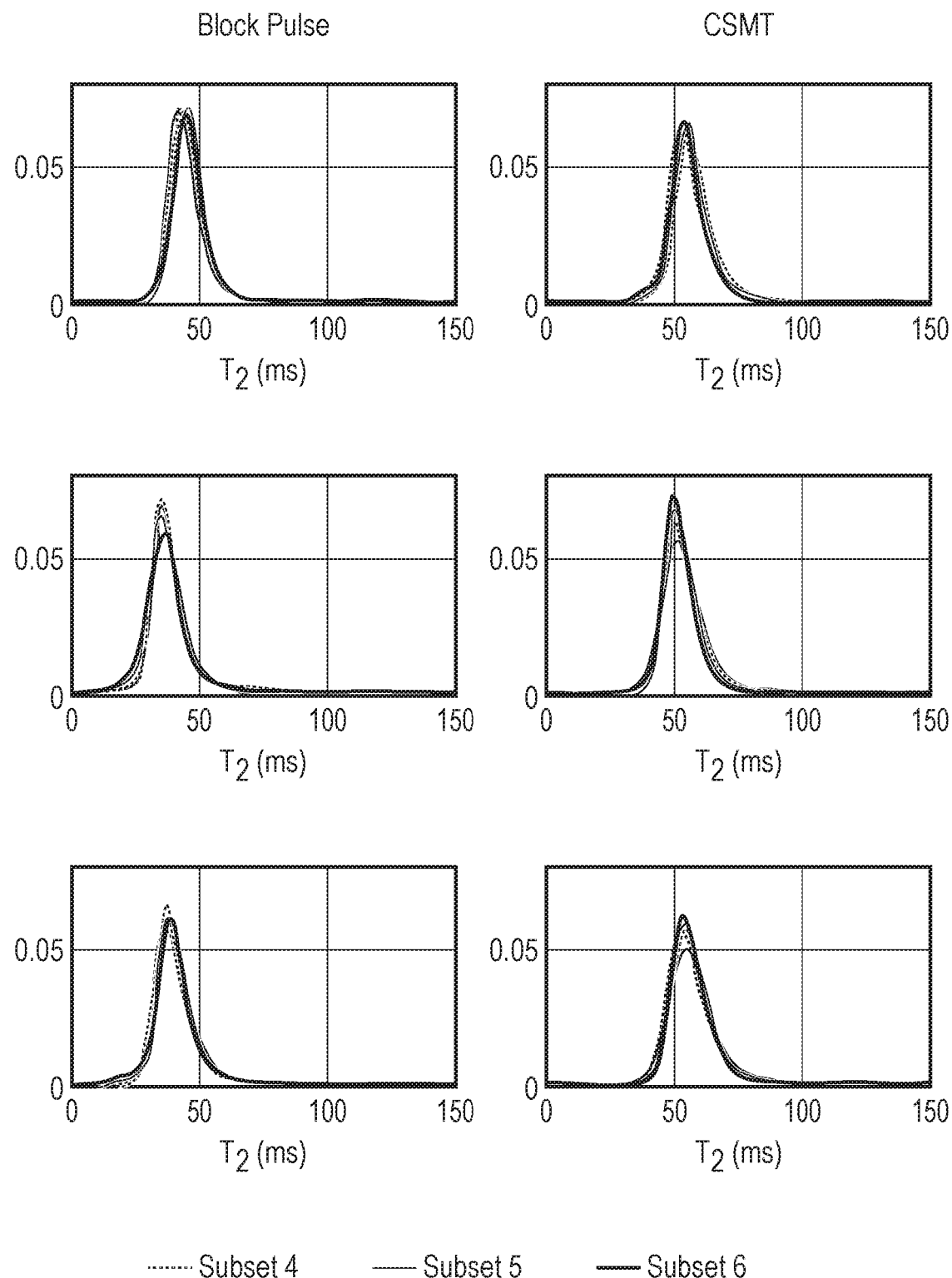

FIG. 11 show histograms of $T_1$ and $T_2$ values from white matter for subsets 1-6 of Table 1 for the block and CSMT pulse. The CMST pulse stabilises the $T_1$ values and results in higher $T_2$ values, more consistent with spin echo measurements at 3T. Use of constant saturation aligns the T1 histograms (removes systematic bias in measurement), however, there is still a range of different standard deviations which is to be expected since the different flip angle sets will yield estimates with different precision.

Discussion & Conclusion

Relaxation times from VFA methods are influenced by RF saturation, as shown by FIG. 8. Use of a controlled saturation pulse can be used to hold the background pool in a constant state of saturation for all measurements and this results in data that is internally consistent, providing very similar relaxation time estimates when using different excitation flip angles. This is not the case when using standard block pulse excitation, as shown by FIG. 11. Interestingly, not only does the CSMT approach stabilise $T_1$, it also leads to $T_2$ values (previously reported as underestimated using gradient echo methods (13, 18, 20)) that are more consistent with spin echo methods (19). The proposed CSMT pulses may also be useful for deliberately adding MT weighting to SSFP sequences (12, 16) and potentially measuring z-spectra.

Controlling Magnetisation Transfer and exchange effects in mcDESPOT relaxometry Magnetisation transfer (MT) has been found to contribute to parameter estimation bias in sequences used in the multi-pool relaxometry technique, mcDESPOT (multicomponent driven equilibrium single pulse observation of T1 and T2). Recent work shows that using controlled saturation magnetisation transfer (CSMT) RF-pulses, a two-pool system (free- and bound-pools) can behave as a single pool with modified equilibrium magnetisation and longitudinal relaxation rate. It is also possible to use CSMT to model MT-effects in a three-pool system

TABLE 1

| | SPGR (°) | | | | | | SSFP-180(°) | | | | | | SSFP-0 (°) | |
|---|---|---|---|---|---|---|---|---|---|---|---|---|---|---|
| Subset 1 | 6 | 8 | 10 | 12 | 14 | 16 | 15 | 25 | 35 | 45 | 55 | 65 | 25 | 55 |
| Subset 2 | 6 | 8 | 10 | 12 | 14 | 16 | 15 | 25 | 35 | 45 | 55 | 65 | 25 | 55 |
| Subset 3 | 6 | 8 | 10 | 12 | 14 | 15 | 25 | 35 | 45 | 55 | 65 | 25 | 55 | |
| Subset 4 | 6 | 8 | 10 | 12 | 14 | 16 | 15 | 25 | 35 | 45 | 55 | 65 | 25 | 55 |
| Subset 5 | 6 | 8 | 10 | 12 | 14 | 16 | 15 | 25 | 35 | 45 | 55 | 65 | 25 | 55 |
| Subset 6 | 6 | 8 | 10 | 12 | 14 | 16 | 15 | 25 | 35 | 45 | 55 | 65 | 25 | 55 |

(exchange+MT) and show that under these conditions, the signal behaves as a two-pool system and matches a mcDESPOT model but characterised by different parameters than those originally assumed.

Introduction

Multicomponent DESPOT (mcDESPOT) models tissue response using a system of two or more exchanging 'free' (i.e. MR-visible) magnetisation components. In its two-pool form, mcDESPOT has been used for characterisation of white matter, with the two components usually identified as intra/extracellular water (slow-relaxing) and myelin-water (fast-relaxing). The myelin water fraction (MWF), defined as the fractional size of the fast-relaxing pool relative to the total magnetization, is normally interpreted as a myelin biomarker and has been shown to consistently overestimate the value derived from multiecho CPMG methods (21, 22). White matter is known to yield a strong MT-effect that is not ordinarily modelled in mcDESPOT, and other work has suggested this to be a source for MWF overestimation (23).

The MT-effect may be modelled by the addition of a 'bound' (i.e. macromolecular) pool of magnetisation (24). RF-pulses rotate 'free' magnetisation, but saturate 'bound' magnetisation according to applied RF-power W, where $B_{1,rms}$ is the RMS pulse amplitude over the whole sequence and G is the bound-pool absorption factor, the RF-power being described as follows:

$$W = \pi G \gamma^2 B_{1,rms}^2 \quad [3]$$

The above proposed controlled saturation magnetisation transfer (CSMT) approach has been shown to allow a simple two-pool MT-system (i.e. one free-pool, one bound-pool) to behave as a single free-pool during DESPOT-style relaxometry by keeping W constant over all acquisitions, irrespective of the applied flip angle (FA) (25).

This approach can be extended to consider a system with two free components, of the type typically modelled in mcDESPOT, and how a 'ground-truth' scenario with three pools (i.e. two free-pools and one bound-pool) will produce parameter estimation bias when fitted using a two-pool model that does not include any bound component (hereafter referred to as the 'mcDESPOT' model).

Methods

Figure 12:
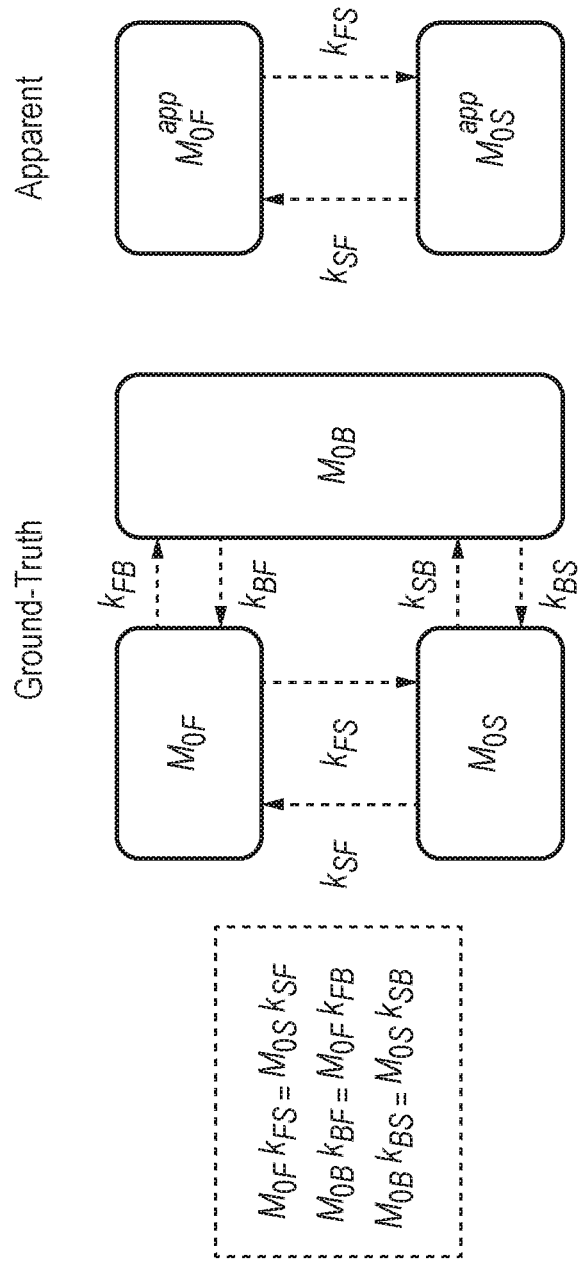
FIG. 12 illustrates the present invention in use.

FIG. 12 illustrates the three-pool configuration, including a bound-pool to account for MT-effects (24). Here, Bloch-McConnell equations are used to model the evolution of magnetisation for such a system and calculate steady-state solutions independently for SPGR and bSSFP. A mcDESPOT model is then fit to three-pool (ground-truth) signals, simulated using either controlled (i.e. the same W regardless of FA) or uncontrolled saturation methods.

In more detail, FIG. 12 shows a three- and a two-pool model, where alternative water-pool exchange pathways are highlighted and chemical equilibrium is assumed for the three-pool model. Here, F represents a fast-relaxing myelin water pool, S is a slow-relaxing free intra/extracellular water pool and B is a bound or macromolecular pool. The aim is to see whether a three-pool system (labelled ground-truth) can behave as a simpler two-pool model (labelled apparent).

Comparison of the differential equations governing mcDESPOT and three-pool models suggests that the three-pool model can be fitted using a two-pool mcDESPOT model, with 'apparent' parameters shown in the below series of equations. Note that the assumption made in this derivation is that the bound-pool is in a steady-state.

$$k_{FS}^{app} = k_{FS} + \frac{k_{BS}k_{FB}}{R_{1B} + k_{BF} + k_{BS} + W} = k_{FS} + \Delta k_{FS} \quad [4]$$

$$k_{SF}^{app} = k_{SF} + \frac{k_{BF}k_{SB}}{R_{1B} + k_{BF} + k_{BS} + W} = k_{SF} + \Delta k_{SF} \quad [5]$$

$$T_{1F}^{app} = \frac{1}{R_{1F} + k_{FB} - \left(\frac{k_{BS}k_{FB} - k_{BF}k_{FB}}{R_{1B} + k_{BF} + k_{BS} + W}\right)}; \quad [6]$$

$$T_{1S}^{app} = \frac{1}{R_{1S} + k_{SB} - \left(\frac{k_{BF}k_{SB} - k_{BS}k_{SB}}{R_{1B} + k_{BF} + k_{BS} + W}\right)}$$

$$M_{0F}^{app} = \frac{M_{0F}R_{1F} + \frac{k_{BF}M_{0B}R_{1B}}{R_{1B} + k_{BF} + k_{BS} + W}}{R_{1F} + k_{FB} - \left(\frac{k_{BS}k_{FB} - k_{BF}k_{FB}}{R_{1B} + k_{BF} + k_{BS} + W}\right)}; \quad [7]$$

$$M_{0S}^{app} = \frac{M_{0S}R_{1S} + \frac{k_{BS}M_{0B}R_{1B}}{R_{1B} + k_{BF} + k_{BS} + W}}{R_{1S} + k_{SB} - \left(\frac{k_{BF}k_{SB} - k_{BS}k_{SB}}{R_{1B} + k_{BF} + k_{BS} + W}\right)};$$

$$MWF^{app} = \frac{M_{0F}^{app}}{M_{0F}^{app} + M_{0S}^{app}} \quad [8]$$

Here, $T_1^X$ are longitudinal relaxation times, $k_{XY}$ are diffusion-driven magnetisation exchange rates and $M_{0X}$ represents equilibrium magnetisation corresponding to pool X.

Results and Discussion

Figure 13:
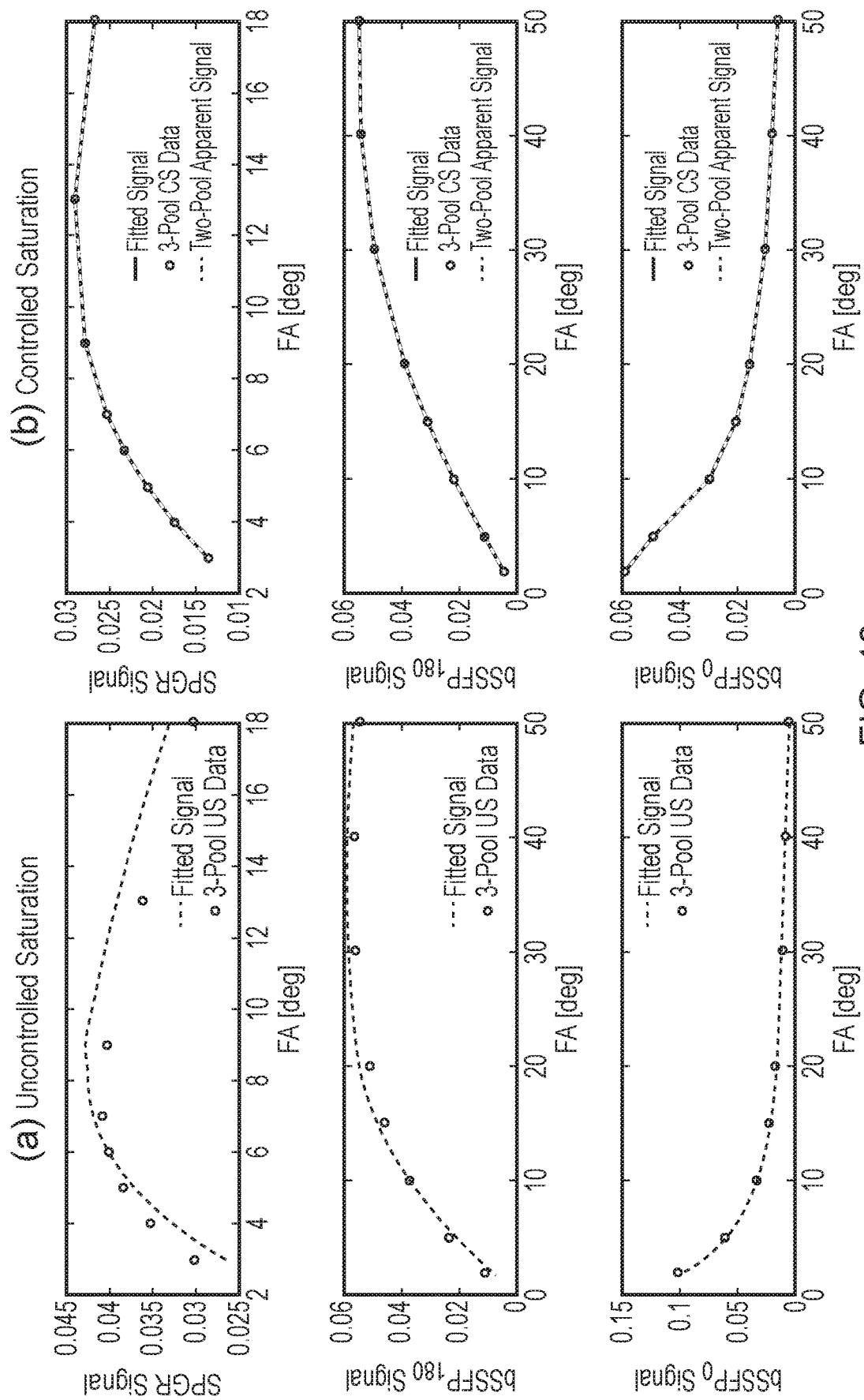
FIG. 13 is a set of charts relating to results of the operation of the described embodiments.

FIG. 13 illustrates how the mcDESPOT model fits to noiseless uncontrolled (US) saturation and controlled saturation (CS) data. The two-pool apparent signal in the CS data corresponds to a fit provided by values calculated using the apparent expressions defined in equations [4] to [8]. A poor fit is seen for uncontrolled saturation but is significantly improved using controlled saturation. Three-pool parameters were set to: $T_{1B}$=1.0 s, $T_{1F}$=0.4 s, $T_{1S}$=1.15 s, $T_{2F}$=0.02 s, $T_{2S}$=0.08 s, $M_{0B}$=0.2, $M_{0F}$=0.25, $M_{0S}$=0.2, $k_{FS}$=9 s$^{-1}$, $k_{FB}$=$k_{SB}$=5 s$^{-1}$, G=1.4×10$^{-5}$ s and $B_{1,rms}$=2.86 μT.

When saturation is uncontrolled, a mcDESPOT model fits poorly (NRMSE=6.4%) to simulated three-pool data, particularly for SPGR, as shown in FIG. 13(a). This results in inaccurate parameter estimation due to the dependence of each apparent parameter on RF-power. In contrast, the same model fits very well (NRMSE=0.03%) for simulated controlled saturation data, as shown in FIG. 13(b). The signal predicted using the mcDESPOT model with the apparent parameter values in equations [4] to [8] also fits very well (NRMSE=0.25%), although not perfectly because the bound-pool steady-state assumption is an approximation. Using CSMT, a three-pool system behaves as a two-pool model, characterised by the parameters in equations [4] to [8]; model dimensionality is reduced without explicitly modelling a bound-pool, as performed previously (24).

Equations [4] to [8] indicate that given no direct exchange between MR-visible pools, an apparent exchange ($\Delta k_{FS}$) remains that is solely mediated by the bound-pool; these additional exchange pathways are highlighted in FIG. 12. This implies that the exchange rates observed using mcDESPOT could reflect exchange mediated purely by MT. $\Delta k_{FS}$ increases almost linearly with $k_B$ but decreases for larger $B_{1,rms}$, as magnetisation entering the bound-pool is lost through saturation.

Figure 14:
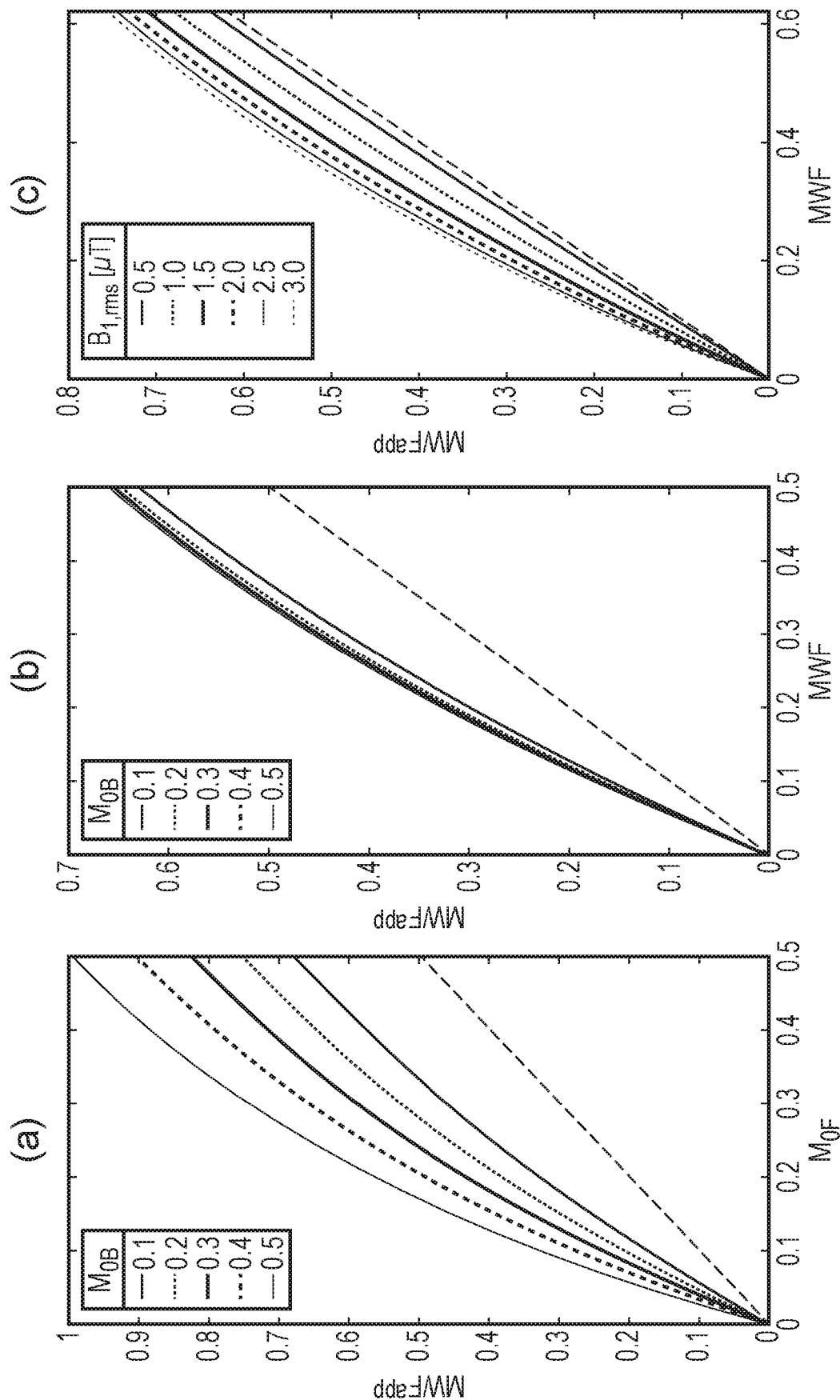
FIG. 14 is a set of charts relating to results of the operation of the described embodiments.
Figure 15:
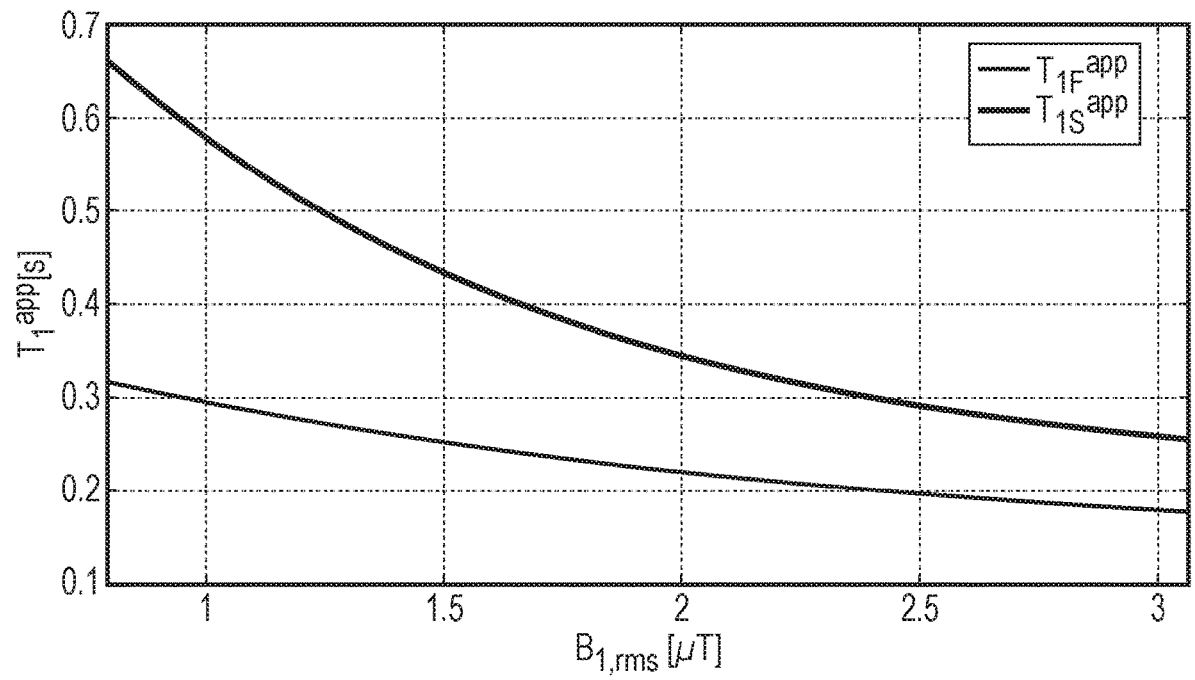
FIG. 15 is a chart relating to results of the operation of the described embodiments.

FIGS. 14 and 15 use the derived parameter expressions to investigate how mcDESPOT fitting would be influenced by the presence of a bound-pool, assuming $k_{FS}$=0 and $k_B = k_{BF} = k_{BS}$. FIG. 14 shows the dependence of apparent MWF on ground-truth MWF (modelled as a fraction of (a) total magnetisation or (b) MR-visible magnetisation) for different $M_{OB}$ and pulse amplitudes. For (a) and (b), $B_{1,rms}=2.86$ µT is constant and for (c), $M_{OB}=0.2$ is constant. FIG. 15 shows the dependence of each pool longitudinal relaxation time on pulse amplitude. For both FIGS. 14 and 15, all other parameters are as for FIG. 13.

FIG. 14 suggests that the apparent MWF, as described by equations [4] to [8], is not the same as the true MWF, defined as $$\frac{M_{0F}}{M_{0F} + M_{0S}},$$

but that the relationship is monotonic and relatively insensitive to changes in bound-pool fraction. It also consistently overestimates MWF, as has been observed previously. However, FIG. 14(c) shows that $MWF^{app}$ is strongly influenced by RF-power level, with lower W leading to a closer relationship to the ground-truth.

FIG. 15 demonstrates that higher $B_{1,rms}$ leads to reduced apparent longitudinal relaxation times, as has been reported before (25). This has clear implications for the use of $T_1$ as a quantitative tissue parameter which must therefore be reported with the corresponding $B_{1,rms}$ with which it was obtained.

CONCLUSIONS

In conclusion, a three-pool system can be modelled using two-pools and derived apparent parameter expressions in [4] to [8]. MT-effects can lead to bias in estimated parameter values and CSMT is needed to obtain a good fit. As such, the ability to achieve CSMT conditions can also improve the reliability of the MWF estimation.

Pulse Rate Dependent Controlled Saturation MT

In relaxometry, the above described ability to control the saturation induced makes it possible to achieve measurements where the amount of saturation remains constant for all images necessary to measure the relaxation times M0, T1 and T2. For fast sequences, where consecutive pulses are applied with times intervals shorter then T1, the saturation can be parameterized by the root mean square amplitude of an arbitrary RF pulse, $B_1^{rms}$, the energy of which is spread over a repetition period TR, as follows:

$$\langle \overline{W} \rangle = \pi(\gamma B_1^{rms})^2 G(\Delta) = \langle W \rangle \frac{T_{RF}}{TR} \qquad [9]$$

Typically, different flip angles used to measure MR images induce different instant saturations <W>. The multi-band pulses described above allow <W> to be chosen independent of the desired flip angle, with the parameters of the pulse being calculated based on a target flip angle.

An alternative approach to control the saturation is to allow the total RF energy, <W>, to vary for different flip angles and adjust both $T_{RF}$ and/or TR in order to obtain the desired value of <$\overline{W}$>. As an example, <W> can be doubled in one sequence compared to another, and TR can also be doubled in order to maintain a constant average saturation <$\overline{W}$>.

This approach allows CSMT to be achieved using an MR scanner without any software modification. As such, it will be appreciated that any suitable MR scanning system may be used, including but not limited to the system described with reference to FIG. 2. For example, the CSMT calculation program 151 may be configured to calculate the timing parameters of the RF pulse, that is, the repetition period or pulse duration, for each defined flip angle such that a constant average saturation is maintained, and instruct the RF system 160 to transmit the RF pulses to the RF coil 173 according to those parameters. Alternatively, the computer system 100 may comprise a pulse timing program (not shown) configured to define the timing parameters of each RF pulse, and instruct the RF system 160 to transmit the RF pulses to the RF coil 173 according to those parameters. The MR scanner 170 will then scan the object as described above to generate T1 and T2 maps of the scanned object to be displayed on the visual display device 141.

CSMT to Achieve MT Weighting

Conventional MT-weighting typically adds dedicated off-resonance pulses to saturate the background pool prior to imaging. An image of an object, such as a brain, is then obtained with this saturation pulse, $S_{MT}$. This is known commonly as MT-weighting. A corresponding image of the same objection is also obtained without the saturation pulse, $S_0$, in order to generate what is known as an MT-ratio image, $(S_0-S_{MT})/S_0$. The consequent ratio image is known to be extremely sensitive to myelination and has typically been use to access multiple-sclerosis populations.

The RF-pulses described herein can be used to generate these type of contrasts using steady-state sequences such as (and not exclusively) Spoiled Gradient Recalled Echo (SPGR) or balanced Steady State Free Precession (bSSFP), which were previously inaccessible.

Inhomogeneous MT (ihMT) is a further extension of MT-weighting where MT-weighted images are obtained using dedicated off-resonance pulses at positive frequency-offsets, negative frequency-offsets and simultaneous positive and negative frequency-offsets. These MT-weighted images are then used to generate an MT-ratio image relative to an image with no dedicated off-resonance excitation. The obtained ratio images have been shown to be sensitive to MT effects due dipolar interactions which are known to be is specific to lamellar structures such as the ones found in myelin. ihMT has the promise to be a myelin specific biomarker which can be to identify demyelination diseases such as multiple-sclerosis.

The RF-pulses described herein can be used to generate this type of contrasts using fast steady-state sequences such as (and not exclusively) SPGR and bSSFP, which were previously not possible.

CSMT to Obtain Relaxometry in the Limit of $B_1^{rms}=0$:

A consequence of the above method is that the measured M0 and T1 values are now direct function of the power, $B_1^{rms}$, employed. However, it is not always possible to achieve a set $B_1^{rms}$ across all equipment. Furthermore, the interference of the measured objects with the RF field is expected to induce spatial variations within the measured object, in other words, the same tissue will have different M0/T1 values depending on whether that tissue is located in the centre or the periphery of the imaged object. For example, M0/T1 measurements for a particular type of brain tissue at the centre of the brain may be different from those measured for the same type of brain tissue at the edges of the brain.

To overcome this, a theoretical limit of using the above CSMT when the RF power is zero, $B_1^{rms}=0$, was explored, which will allow M0/T1 maps to be obtained that have no dependency on the particular $B_1^{rms}$ chosen. To do this, measurements were made with a finite $B_1^{rms}$, and then extrapolated to $B_1^{rms}=0$. In this limit, both the apparent recovery rate and the equilibrium magnetization can be linearly approximated in the form:

$$T_1^{CSMT} \approx T_1^0 + T_1^{slope}(\gamma B_1^{rms})^2 \qquad [10]$$

and $$M_0^{CSMT} \approx M_0^0 + M_0^{slope}(\gamma B_1^{rms})^2 \qquad [11]$$

In doing so, it is possible to obtain relaxation maps which are independent of $B_1^{rms}$. This removes the issue of spatial variation, and enables the method described herein to be applied to any MR scanner.

REFERENCES 1. http://www.corywritingcleveland.com/samples/CWRMedicine_Fall_2013.pdf
2. Weiskopf N, Suckling J, Williams G, Correia M M, Inkster B, Tait R, Ooi C, Bullmore E T, Lutti A. 2013. Quantitative multi-parameter mapping of R1, PD*, MT, and R2* at 3 T: a multi-center validation. Front Neurosci. doi:10.3389/fnins.2013.00095
3. Mezer A. et al. Quantifying the local tissue volume and composition in individual brains with magnetic resonance imaging. Nat. Med. 19, 1667-1672 (2013); doi:10.1038/nm.3390;
4. Deoni S C, Williams S C, Jezzard P, Suckling J, Murphy D G, Jones D K. Standardized structural magnetic resonance imaging in multicentre studies using quantitative T1 and T2 imaging at 1.5 T. Neuroimage 2008; 40:662-671.
5. Kingsley, P. B. (1999), Methods of measuring spin-lattice (T1) relaxation times: An annotated bibliography. Concepts Magn. Reson., 11: 243-276. doi:10.1002/(SICI)1099-0534 (1999) 11:4<243::AID-CMR5>3.0.CO;2-C
6. Stikov, N., Boudreau, M., Levesque, I. R., Tardif, C. L., Barral, J. K. and Pike, G. B. (2015), On the accuracy of T1 mapping: Searching for common ground. Magn. Reson. Med., 73: 514-522. doi:10.1002/mrm.25135
7. Wolff, S. D. and Balaban, R. S. (1989), Magnetization transfer contrast (MTC) and tissue water proton relaxation in vivo. Magn. Reson. Med., 10: 135-144. doi:10.1002/mrm.1910100113
8. Ou X, Gochberg D F. MT effects and T1 quantification in single-slice spoiled gradient echo imaging. Magn Reson Med 2008; 59:835-845; doi:10.1002/mrm.21550
9. Sled J G, Pike G B. Quantitative imaging of magnetization transfer exchange and relaxation properties in vivo using MRI. Magn Reson Med 2001; 46(5):923-931; doi: 10.1002/mrm.1278
10. Buonincontri, G. and Sawiak, S. J. (2016), MR fingerprinting with simultaneous B 1 estimation. Magn. Reson. Med., 76: 1127-1135. doi:10.1002/mrm.26009
11. Ma, D., Pierre, E. Y., Jiang, Y., Schluchter, M. D., Setsompop, K., Gulani, V. and Griswold, M. A. (2016), Music-based magnetic resonance fingerprinting to improve patient comfort during MRI examinations. Magn. Reson. Med., 75: 2303-2314. doi:10.1002/mrm.25818
12. Bieri O. and Scheffler K. On the origin of apparent low tissue signals in balanced SSFP. Magn Reson Med. 2006; 56(5): 1067-74.
13. Yosef Al-Abasse and Gunther Helms. Influence of pulse length and shape on variable flip angle T1 mapping of the human brain. Proc. Intl. Soc. Mag. Reson. Med. 24 (2016)
14. Graham S J, Henkelman R M. Understanding pulsed magnetization transfer. J Magn Reson Imaging 1997; 7:903-912.
15. Deoni S C L, Rutt B K, Peters T M. Rapid combined T1 and T2 map-ping with gradient recalled acquisition in the steady-state. Magn Reson Med 2003; 46:515-526
16. Gloor, M, et al. Nonbalanced SSFP-based quantitative magnetization transfer imaging. Magn Reson Med 2010; 64:149-156
17. L. Yarnykh, Vasily. Actual Flip-Angle Imaging in the Pulsed Steady State: A Method for Rapid Three-Dimensional Mapping of the Transmitted Radiofrequency Field. Magn Reson Med 2007; 57:192-200
18. Teixeira, R. P. A. G., Malik, S. J. and Hajnal, J. V. (2017), Joint system relaxometry (JSR) and Crámer-Rao lower bound optimization of sequence parameters: A framework for enhanced precision of DESPOT T1 and T2 estimation. Magn Reson Med. doi: 10.1002/mrm.26670
19. J. Stanisz, et al. T1,T2 Relaxation and Magnetization Transfer in Tissue at 3T. Magn Reson Med. 2005; 54:507-512;
20. Crooijmans, H J A et al. Finite R F pulse correction on DESPOT2; Magn Reson Med. 2011; 65:858-862.
21. MacKay, A. L. et al. In vivo visualization of myelin water in brain by magnetic resonance. Magn. Reson. Med. 31, 673-677 (1994).
22. Alonso-Ortiz, E., Levesque, I. R. & Pike, G. B. MRI-based myelin water imaging: a technical review. Magn. Reson. Med. 73, 70-81 (2015).
23. Zhang, J., Kolind, S. H., Laule, C. & MacKay, A. L. How does magnetization transfer influence mcDESPOT results? Magn. Reson. Med. 74, 1327-1335 (2015).
24. Liu, F., Block, W. F., Kijowski, R. & Samsonov, A. A. Rapid multicomponent relaxometry in steady state with correction of magnetization transfer effects. Magn. Reson. Med. 75, 1423-1433 (2016).
25. Teixeira, R. P. A. G., Price, A. N., Baburamani, A. A., Malik, S. J. & Hajnal, J. V. Robust VFA relaxometry by Continuous Saturation of Magnetization Transfer (CSMT) effects with non-selective multi-band pulses. in ISMRM (2017).

The invention claimed is:

1. A method of calculating a multi-band radio frequency (RF) pulse for use in magnetic resonance (MR) imaging or MR spectroscopy, wherein the multi-band RF pulse comprises an on-resonance band and at least one off-resonance band, and wherein the method comprises:
   defining a target degree of rotation in the magnetisation, M, of a free pool of protons in an object; and
   calculating the parameters of the on-resonance band and the at least one off-resonance band based on the target degree of rotation, wherein the calculated parameters of the on-resonance band the at least one off-resonance band are such that, when the multi-band RF pulse is used as a parameter of MR imaging or spectroscopy, a predetermined amount of saturation of magnetisation occurs in a bound pool of protons in the object,
   wherein the free pool of protons is a first spin population such that in use the duration of the multi-band RF pulse is shorter than a first transverse relaxation time (T2) of the first spin population, and wherein the bound pool of protons is a second spin population such that in use the duration of the multi-band RF pulse is longer than a second transverse relaxation time (T2) of the second spin population.

2. An apparatus for calculating a multi-band RF pulse for use in magnetic resonance (MR) imaging or MR spectroscopy, wherein the multi-band RF pulse comprises an on-resonance band and at least one off-resonance band, the apparatus comprising:
- a processor;
- a computer readable medium, the computer readable medium storing on or more instruction(s) arranged such that when executed the processor is caused to:
  - (a) define a target degree of rotation in the magnetisation, M, of a free pool of protons in an object; and
  - (b) calculate the parameters of the on-resonance band and the at least one off-resonance band based on the target degree of rotation, wherein the calculated parameters of the on-resonance band the at least one off-resonance band are such that, when the multi-band RF pulse is used as a parameter of MR imaging or spectroscopy, a predetermined amount of saturation of magnetisation occurs in a bound pool of protons in the object, wherein the free pool of protons is a first spin population such that in use the duration of the multi-band RF pulse is shorter than a first transverse relaxation time (T2) of the first spin population, and wherein the bound pool of protons is a second spin population such that in use the duration of the multi-band RF pulse is longer than a second transverse relaxation time (T2) of the second spin population.

3. A method according to claim 1, wherein the calculating the parameters of the on-resonance band and the at least one off-resonance band comprises:
- calculating the parameters of the on-resonance band based on the target degree of rotation, wherein the calculated parameters of the first band are such that, when the multi-band RF pulse is used as a parameter of MR imaging or spectroscopy, the target degree of rotation is induced in the free pool of protons; and
- calculating the parameters of the at least one off-resonance band based on the on-resonance band, wherein the calculated parameters of the at least one off-resonance band are such that, when the multi-band RF pulse is used as a parameter of MR imaging or spectroscopy, the predetermined amount of saturation of magnetisation occurs in the bound pool of protons.

4. A method according to claim 1, further comprising:
- calculating a plurality of multi-band RF pulses corresponding to a plurality of target degrees of rotation, wherein the predetermined amount of saturation of magnetisation is constant for the plurality of multi-band RF pulses such that, when used as a parameter of MR imaging or spectroscopy, the plurality of multi-band RF pulses achieve controlled Magnetisation Transfer conditions.

5. A method according to claim 4, wherein the plurality of multi-band RF pulses achieve constant Magnetisation Transfer conditions.

6. A method according to claim 1, further comprising setting the predetermined amount of saturation of magnetisation based on a reference multi-band RF pulse.

7. A method according to claim 6, wherein the setting the predetermined amount of saturation of magnetisation comprises:
- (i) defining a reference degree of rotation in the magnetisation, M of a free pool of protons in an object;
- (ii) calculating a reference multi-band RF pulse corresponding to the reference degree of rotation;
- (iv) determining the amount of saturation of magnetisation occurring in a bound pool of protons of the object when the reference multi-band RF pulse is used as a parameter of MR imaging or spectroscopy; and
- (iii) setting the predetermined amount of saturation of magnetisation based on the determined amount of saturation of magnetisation.

8. A method according to claim 1, further comprising setting the predetermined amount of saturation of magnetisation based on a target amount of saturation.

9. A method according to claim 1, wherein defining the target degree of rotation of magnetisation, M, comprises defining a target flip angle, $\alpha$.

10. A method of magnetic resonance (MR) imaging, comprising:
- calculating a plurality of multi-band RF pulses according to claim 1;
- performing an MR scan on an object using the plurality of multi-band RF pulses to thereby obtain a plurality of MR signals, wherein each of the plurality MR signals corresponds to one of the plurality of a multi-band RF pulses; and
- generating an image of the object based on the plurality of MR signals.

11. A method according to claim 10, wherein the method further comprises measuring the relaxation times T1 and T2 of the plurality of MR signals, wherein the generating an image of the object preferably further comprises generating a T1 map and/or a T2 map.

12. A method according to claim 10, wherein the generating an image further comprises calculating a myelin water fraction from the plurality of MR signals.

13. A method according to claim 10, wherein the generating an image comprises generating a saturation weighted image.

* * * * *